(12) United States Patent
Chu et al.

(10) Patent No.: US 10,529,921 B2
(45) Date of Patent: Jan. 7, 2020

(54) MEMORY STRUCTURE FOR USE IN RESISTIVE RANDOM ACCESS MEMORY DEVICES AND METHOD FOR USE IN MANUFACTURING A DATA STORAGE DEVICE

(71) Applicant: Australian Advanced Materials Pty Ltd, Subiaco (AU)

(72) Inventors: Dewei Chu, Kensington (AU); Sean Suixiang Li, Turramurra (AU)

(73) Assignee: Australian Advanced Materials Pty Ltd, Subiaco (AU)

( * ) Notice: Subject to any disclaimer, the term of this patent is extended or adjusted under 35 U.S.C. 154(b) by 0 days.

(21) Appl. No.: 15/579,775

(22) PCT Filed: Jun. 3, 2016

(86) PCT No.: PCT/AU2016/050455
§ 371 (c)(1),
(2) Date: Dec. 5, 2017

(87) PCT Pub. No.: WO2016/191830
PCT Pub. Date: Dec. 8, 2016

(65) Prior Publication Data
US 2018/0175291 A1 Jun. 21, 2018

(30) Foreign Application Priority Data

Jun. 5, 2015 (AU) .................. 2015902109
Aug. 24, 2015 (AU) .................. 2015903413
May 24, 2016 (AU) .................. 2016901967

(51) Int. Cl.
*G11C 11/56* (2006.01)
*G11C 13/00* (2006.01)
(Continued)

(52) U.S. Cl.
CPC .......... *H01L 45/1233* (2013.01); *G11C 11/56* (2013.01); *G11C 11/5685* (2013.01);
(Continued)

(58) Field of Classification Search
None
See application file for complete search history.

(56) References Cited

U.S. PATENT DOCUMENTS 6,872,963 B2   3/2005   Kostylev et al.
8,076,261 B2   12/2011  Hwang et al.
(Continued)

FOREIGN PATENT DOCUMENTS

CN   101159314 A   4/2008
CN   101281952 A   10/2008
(Continued)

OTHER PUBLICATIONS

Younis, Adnan, et al. "Interface-Engineered Resistive Switching: CeO2 Nanocubes as High-Performance Memory Cells." ACS Applied Materials & Interfaces, vol. 5, No. 19, 2013, pp. 9429-9434., doi:10.1021/am403243g.*

(Continued)

*Primary Examiner* — J. E. Schoenholtz
(74) *Attorney, Agent, or Firm* — Dinsmore & Shohl, LLP

(57) ABSTRACT

A memory structure for use in a memory device comprising at least one first layer and at least one second layer: the at least one first layer comprises a plurality of a first element, and the at least one second layer comprises a plurality of a second element; and, wherein the memory structure has an electrical resistive state that can be changed in response to an electromotive force being applied thereto.

33 Claims, 19 Drawing Sheets

(51) Int. Cl.
*H01L 27/24* (2006.01)
*H01L 45/00* (2006.01)

(52) U.S. Cl.
CPC ...... *G11C 13/0007* (2013.01); *H01L 27/2463* (2013.01); *H01L 45/085* (2013.01); *H01L 45/1253* (2013.01); *H01L 45/146* (2013.01); *H01L 45/1608* (2013.01); *H01L 45/1641* (2013.01); *G11C 2213/34* (2013.01); *G11C 2213/71* (2013.01)

(56) References Cited

U.S. PATENT DOCUMENTS

| | | | |
|---|---|---|---|
| 8,183,553 | B2 | 5/2012 | Phatak et al. |
| 8,455,852 | B2 | 6/2013 | Quitoriano et al. |
| 8,471,234 | B2 | 6/2013 | Tong et al. |
| 8,487,292 | B2 | 7/2013 | Sekar et al. |
| 2009/0026433 | A1 | 1/2009 | Chiang |
| 2009/0040805 | A1 | 2/2009 | Park et al. |
| 2010/0117053 | A1 | 5/2010 | Sekar et al. |
| 2011/0097843 | A1 | 4/2011 | Jin et al. |
| 2011/0140762 | A1 | 6/2011 | Jiang et al. |
| 2012/0104346 | A1 | 5/2012 | Yi et al. |
| 2013/0082228 | A1* | 4/2013 | Parrillo ............... H01L 45/08 257/4 |
| 2013/0126818 | A1 | 5/2013 | Chin et al. |
| 2014/0264224 | A1 | 9/2014 | Zhang et al. |
| 2015/0129826 | A1 | 5/2015 | Wang |
| 2017/0032837 | A1* | 2/2017 | Ge ............... H01L 45/08 |

FOREIGN PATENT DOCUMENTS

| | | |
|---|---|---|
| CN | 102903847 A | 1/2013 |
| CN | 103178208 A | 6/2013 |
| DE | 102005035445 A1 | 2/2007 |
| WO | 2014020478 A2 | 2/2014 |

OTHER PUBLICATIONS

Ismail et al., Room-Temperature fabricated, fully transparent resistive memory based on ITO/CeO2/ITO structure for RRAM applications, Solid State Communications, vol. 202, pp. 28-34, 2015.
Yang et al., "Controlled Synthesis and Self-Assembly of CeO2 Nanocubes", Journal of the American Chemical Society, pp. 9330-9331, 2006, Abstract.
Younis et al., "Interface Thermodynamic State-Induced High-Performance Memristors", American Chemical Society, Langmuir, 20, pp. 1183-1189, 2014, including Supporting Information, pp. 1-2.
Younis et al., "Tuning the surface oxygen concentration of {111} surrounded ceria nanocrystals for enhanced photocatalytic activities", Nanoscale, pp. 378-387, 2016.
Younis et al., "Interface-Engineered Resistive Switching: CeO2 Nanocubes as High-Performance Memory Cells", ACS Applied Materials & Interfaces, pp. 9429-9434, 2013.
Chu et al., "Growth and self-assembly of BaTiO3 nanocubes for resistive switching memory cells", Journal of Solid State Chemistry, 214, pp. 38-41, 2014.
Kato et al., "Nano-sized cube-shaped single crystalline oxides and their potentials; composition, assembly and functions", Advanced Powder Technology, 25, pp. 1401-1414, 2014.
Zou, "Flexible Nonvolatile Cu/CuxO/Ag ReRAM Fabricated Using Ink-Jet Printing Technology", Thesis submitted to the Graduate Faculty of Auburn University, pp. 1-67, Auburn, Alabama, May 4, 2014.
UK Patent Office Search Report dated Jan. 16, 2018, pertaining to Application No. GB1620835.7 filed Dec. 7, 2016.
UK Patent Office Search Report dated Jan. 16, 2018, pertaining to Application No. GB1710470.4 recorded Jun. 29, 2017.
International Search Report completed Aug. 8, 2016, pertaining to PCT/AU2016/050455 filed Jun. 3, 2016.
International Search Report and Written Opinion completed Mar. 14, 2018, pertaining to PCT/AU2017/051348 filed Dec. 7, 2017.
Ismail et al., "Performance stability and functional reliability in bipolar resistive switching of bilayer ceria based resistive random access memory devices", Journal of Applied Physics, vol. 117, No. 8, 2015, pp. 1-6.
Extended European Search Report dated Mar. 13, 2019, pertaining to EP16802260 (239 pages).

* cited by examiner

Switch Cycles (No)

MEMORY STRUCTURE FOR USE IN RESISTIVE RANDOM ACCESS MEMORY DEVICES AND METHOD FOR USE IN MANUFACTURING A DATA STORAGE DEVICE

FIELD OF THE INVENTION

This disclosure relates to the field of non-volatile data storage and more specifically to metal oxide resistive random access memory (ReRAM).

BACKGROUND

ReRAM is one of the most promising technologies for non-volatile memory due to its simple structure, high operation speed, low power consumption, feasibility of vertical stacking and good compatibility with the current complementary metal oxide semiconductor (CMOS) technology.

Different dielectric materials spanning from perovskites to transition metal oxides to chalcogenides have been investigated as potential materials for ReRAM applications. Up to now, multiple inorganic and organic material systems have been revealed to possess thermal or ionic resistive switching effects.

ReRAM resistive states have previously been realised through the manipulation of voltages, whereas this invention demonstrates that resistive states can be realised and tuned by a novel memory structure of metal oxide layers.

SUMMARY OF THE INVENTION

In a first aspect the invention provides a memory structure for use in a memory device comprising at least one first layer and at least one second layer:
the at least one first layer comprises a plurality of a first element, and the at least one second layer comprises a plurality of a second element; and,
wherein the memory structure has an electrical resistive state that can be changed in response to an electromotive force being applied thereto.

In a second aspect the invention provides a method of manufacture of a memory device, the memory device comprising a memory structure according to the first aspect, the memory device fabricated using chemical and physical deposition processes.

In a third aspect the invention provides a method of manufacture of a memory device, the memory device comprising a memory structure according to the first aspect, the memory device fabricated using solution processed techniques.

In a fourth aspect the invention provides a method of manufacturing a memory structure according to the first aspect for use in a memory device comprising printing a film comprising a plurality of separate elements, wherein each of the separate elements is such that they have an electrical resistive state that can be changed in response to an electromotive force being applied thereto.

In a fifth aspect the invention provides a method of increasing the number of resistive states in a memory device, the method comprising increasing the number of pairs of alternating layers of a metal oxide and a doped metal oxide, wherein each layer of metal oxide or doped metal oxide has an electrical resistive state that can be changed in response to an electromotive force being applied thereto.

In a sixth aspect the invention provides a method of increasing the number of resistive states in a memory device, the method comprising increasing the number of pairs of alternating layers of a metal oxide and a doped metal oxide, wherein the memory device has an electrical resistive state that can be changed in response to an electromotive force being applied thereto.

In a seventh aspect the invention provides the use of a dispersion of cerium(IV) oxide nanocubes and a dispersion of indium-doped cerium(IV) oxide nanocubes in the preparation of a memory structure according to the first aspect.

In an eighth aspect the invention provides the use of a dispersion of cerium(IV) oxide nanocubes in the preparation of an ink for preparing a memory structure according to the first aspect.

In a ninth aspect the invention provides an ink comprising doped or undoped nanocubes for use in fabricating a memory structure according to the first aspect.

Embodiments of the invention relate to a memory structure that utilizes metal oxide nanocrystals. Preferably such embodiments are rewritable, non-volatile and/or flexible, and include a resistive random access memory cell structure which is able to store one or more binary bits of data.

By positioning the layers of metal oxide nanocrystals with doped metal oxide nanocrystals adjacent to each other, multiple resistive states can be achieved.

The highest and the lowest resistance states are known as HRS and LRS, respectively. Any resistive states that are present between the HRS and LRS values are known as intermediate resistive states. Using indium (as an example) as a dopant to dope metal oxide nanocrystals, creates charge traps which contribute to the realisation of intermediate resistive states.

The number of resistive states can be tuned by adjusting the number of layers in the memory structure. By adjusting the layer structure, tuneable resistive states can be realized. A multi-level memory structure can be achieved by increasing the number of alternating layers. When fabricated, the number and resistance value of the resistive states that can be realised in the memory structure are permanently set and do not change.

The memory structure can be used in memory devices which utilise resistive states to store data. There are a range of methods for depositing a metal oxide layer onto a substrate for use in a memory device. This includes chemical and physical deposition methods such as sputtering, evaporation, chemical vapour deposition (CVD), physical vapour deposition (PVD) and solution processed techniques such as spin coating, inkjet printing and other printing techniques, spray coating and gravure.

The memory structure can be used on a range of substrates including glass, plastic, silicon and other materials that provide a suitable surface for depositing a layer of metal oxide nanocubes.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings, in which.

DETAILED DESCRIPTION OF THE INVENTION

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

In a first aspect the invention provides a memory structure for use in a memory device comprising at least one first layer and at least one second layer:

the at least one first layer comprises a plurality of a first element, and the at least one second layer comprises a plurality of a second element; and, wherein the memory structure has an electrical resistive state that can be changed in response to an electromotive force being applied thereto.

1. Materials 1.1 The Element

In some embodiments, the first element is a metal oxide. In some embodiments, the second element is a metal oxide doped with a dopant (herein referred to as "doped metal oxide"). In some embodiments, both the metal oxide and the doped metal oxide are crystalline. Thus, in some embodiments, the first element is a crystalline particle of a metal oxide, and the second element is a crystalline particle of a doped metal oxide. The crystalline particle of the metal oxide or doped metal oxide can be any crystal structure which the crystals of the metal oxide or doped metal oxide can form, e.g. cubic, tetragonal, hexagonal, orthorhombic, monoclinic or triclinic.

Preferably, the first element is a crystalline particle of a metal oxide having a cubic structure.

The metal oxide may be a semiconductor or an insulator. The metal oxide may, for example, be cerium(IV) oxide ($CeO_2$), indium(III) oxide ($In_2O_3$), or a perovskite oxide (e.g. calcium titanium oxide ($CaTiO_3$)).

Figure 1:
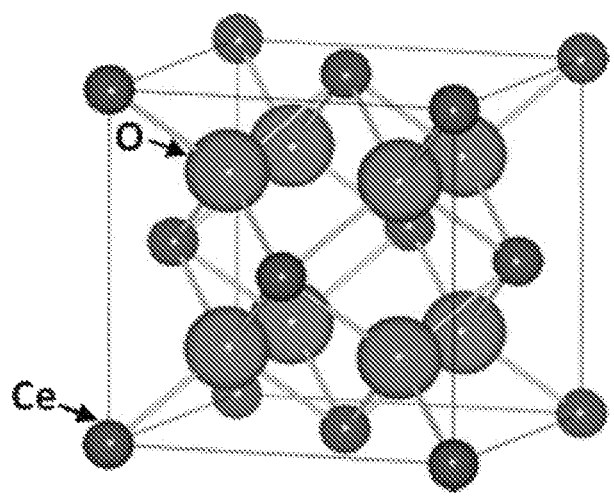
FIG. 1 shows the structure of the stoichiometric $CeO_2$ with the oxygen (represented by big red balls) four coordinated and the cerium (represented by small blue balls) eight coordinated.

An advantage of using a metal oxide is that it exhibits properties that make it well suited to providing the electrical resistive state that can be changed in response to an electromotive force being applied thereto. In preferred embodiments, the metal oxide is cerium(IV) oxide ($CeO_2$). Cerium (IV) oxide is a wide bandgap semiconductor and it is particularly attractive for use in a memory device because its properties are well suited to allowing a change in the resistive state in response to an electromotive force being applied thereto. Cerium(IV) dioxide ($CeO_2$) has a fluorite structure (FCC) with space group Fm3m and it consists of a simple cubic oxygen sub-lattice with the cerium ions occupying alternate cube centres, as shown in FIG. 1. This figure shows the structure of the stoichiometric $CeO_2$ with the oxygen (represented by big red balls) four coordinated and the cerium (represented by small blue balls) eight coordinated. The cerium is at the centre of the tetrahedron whose corners are occupied by oxygen atoms.

In this embodiment, the second element is a crystalline particle of a doped metal oxide having a cubic structure.

The dopant in the doped metal oxide may be a metal having an ionic radius similar to that of the metal of the metal oxide (the host metal) that the dopant will substitute. One advantage of the dopant having a similar ionic radius to the host metal is that there is less lattice distortion in the crystalline particle of doped metal oxide.

An advantage of using a doped metal oxide is that it allows resistive states to be tuned in a controlled manner. In this regard, the addition of a dopant alters the way in which the metal oxide's electrical resistive state changes in response to an electromotive force.

The amount of dopant in the doped metal oxide may be about 0.1 wt % to about 30 wt %. In some embodiments, the amount of dopant in the doped metal oxide is about 1 wt % to about 25 wt %. In some embodiments, the amount of dopant in the doped metal oxide is about 2 wt % to about 20 wt %. In some embodiments, the amount of dopant in the doped metal oxide is about 3 wt % to about 15 wt %, e.g. 3 wt %, 4 wt %, 5 wt %, 6 wt %, 7 wt %, 8 wt %, 9 wt %, 10 wt %, 11 wt %, 12 wt %, 13 wt %, 14 wt %, or 15 wt %.

The dopant may, for example, be indium (In), cobalt (Co), gadolinium (Gd), ytterbium (Yb), or samarium (Sm). In preferred embodiments, the dopant is indium (In).

Indium is attractive to use as a dopant for several reasons, including:
1) The valency of indium ions is +3, while the valency of cerium ions is usually +4; thus more oxygen vacancies can be introduced in a doped metal oxide.
2) Using indium as a dopant in the doped metal oxide creates charge traps which contribute to the realisation of intermediate resistive states, which means multiple resistive states can be achieved within the memory structure.
3) The introduction of intermediate resistive states may result in a much higher HRS (high resistive state) value as well as a higher on/off ratio.
4) Indium ions usually have high mobility and can improve the response of a memory device (i.e. switching speed).

In preferred embodiments, the doped metal oxide is cerium(IV) oxide doped with indium (In), i.e. "In-doped $CeO_2$". For example, the doped metal oxide may be 5 wt % In-doped $CeO_2$, 10 wt % In-doped $CeO_2$, or 15 wt % In-doped $CeO_2$.

In preferred embodiments, the crystalline particle of metal oxide is in the form of a cubic nanocrystal, i.e "undoped (or pure) nanocube". In preferred embodiments, the crystalline particle of doped metal oxide is in the form of a cubic nanocrystal, i.e "doped nanocube". Typically, each cubic nanocrystal has a width of from about 2 nm to about 13 nm, e.g. 2 to 13 nm. For example, the width of the nanocubes may be about 5 nm to about 11 nm, such as 5 nm, 6 nm, 7 nm, 8 nm, 9 nm, 10 nm or 11 nm. Preferably, the width of the nanocubes in a given layer is about 8-10 nm. Preferably, the widths of the cubic nanocrystals are similar which increases the uniformity in the arrays formed by the cubic nanocrystals, resulting in better multilevel endurance stability of the structure and uniformity of the resistive switching parameters (e.g. a high ON/OFF ratio), and thereby better overall performance of the device. Moreover, the nanocubes have large surface area which has more defects, and this also contributes to tuneable resistive switching properties.

1.2 The Layer

In some embodiments, each of the layers in the memory structure is formed from one or more two-dimensional arrays of nanocubes. Thus, a layer may be formed from two or more two-dimensional arrays of nanocubes positioned adjacent to each other, i.e. a layer may be formed from a three-dimensional array of nanocubes. In other embodiments the layer is formed in a less ordered arrangement of the nanocubes.

Memory structures may include two or more layers adjacent to one another. Such embodiments have the advantage that this provides a basis for increasing the amount of data that can be stored in the memory structure without the need for increasing the area of the two-dimensional array, and thus the substrate area. For example, the memory structure may comprise two layers, three layers, four layers, five layers, six layers, seven layers, eight layers, nine layers or ten layers. The memory structure may comprise layers of alternating doped and undoped nanocubes. For example, a memory structure with two layers may comprise a layer of undoped nanocubes, and a layer of doped nanocubes. A memory structure with three layers may comprise a layer of doped nanocubes sandwiched between two layers of undoped nanocubes, or a memory structure with three layers may comprise a layer of undoped nanocubes sandwiched between two layers of doped nanocubes. A memory structure with four layers may comprise four layers of alternating doped and undoped nanocubes.

Each layer comprises nanocubes of the same type—i.e doped or undoped (or pure).

In some embodiments, the undoped nanocubes or doped nanocubes self-assemble in clusters horizontally within a layer.

Without wishing to be bound by theory, the inventors hypothesise that self-assembly of the undoped or doped nanocubes is facilitated by intermolecular forces, for example, van der Waals forces and other forces, and the surfactant-mediated surface hydrophobicity of the liquid medium (e.g. a suitable organic solvent and a suitable surfactant) in which the undoped or doped nanocubes are dispersed during preparation.

As a result, each element aligns itself relative to another element to form an array facilitating even and proportional spacing between adjacent nanocubes. The cubic structure in nanometer scale and narrow size dispersion are preferable to form highly coordinated arrays that can be packed closely for data storage. The ultra-small dimension of undoped and doped nanocubes and intermolecular forces, for example van der Waals, forces between the nanocubes may allow the layers to be flexible (for example the layer may follow the curvature of a curved object). The distinct geometry of undoped and doped nanocubes is also responsible for the enhanced multilevel endurance stability and also excellent non-volatile behaviours thus yielding a high on/off ratio.

Each layer may have the same thickness or have different thicknesses. Generally, each layer has a thickness of about 2 nm to about 2 μm. In some embodiments, the thickness of each layer is from about 20 nm to about 500 nm. In some embodiments, the thickness of each layer is from about 40 nm to about 400 nm. In some embodiments, the thickness of each layer is from about 50 nm to about 300 nm. In some embodiments, the thickness of each layer is from about 80 nm to about 200 nm. In some embodiments, the thickness of each layer is from about 100 nm to about 180 nm, e.g. about 100 nm, about 110 nm, about 120 nm, about 130 nm, about 140 nm, about 150 nm, about 160 nm, about 170 nm or about 180 nm.

Differing thicknesses of the layers may affect the resistive states of the memory structure.

The layers have the ability to retain resistive states even after electromotive force is removed. This shows the non-volatile behaviour of the layers.

A layer of doped metal oxide is sometimes referred to herein as a doped layer (or "defect layer"). Reference herein to a defect is a reference to a dopant.

1.3 The Memory Structure

In the memory structure, the layers referred to above are positioned adjacent to one another to form a three dimensional array of nanocubes. Typically this would be achieved through positioning the layers adjacent to each other.

An advantage of positioning two or more two-dimensional arrays adjacent to one another to form a three-dimensional array of nanocubes is that it provides a basis for increasing the amount of data that can be stored in the memory structure without the need for increasing the area of the two-dimensional array, and thus the substrate area.

For example, the memory structure may comprise two layers, three layers, four layers, five layers, six layers, seven layers, eight layers, nine layers or ten layers. The layers may comprise pairs of alternating layers of doped and undoped nanocubes.

In preferred embodiments of the memory structure, the first layer comprises one or more two-dimensional arrays of nanocubes of cerium(IV) oxide, and the second layer comprises one or more two-dimensional arrays of nanocubes of In-doped cerium(IV) oxide. This memory structure comprising a layer of cerium(IV) oxide adjacent to a layer or In-doped cerium(IV) oxide is defined as a pair of alternating layers of doped and undoped metal oxides.

The memory structure comprises layers of doped and layers of undoped metal oxide nanocubes. Due to the distinct geometry of the doped and undoped metal oxide nanocubes and the role of intermolecular forces, for example van der Waals forces between the doped and undoped metal oxide nanocubes, a flexible memory structure may be realised.

Increasing the number of pairs of alternating layers of doped and undoped metal oxide results in an increase in the number of resistive states of the memory structure.

Another property of the memory structure is that the resistive states can remain in the memory structure even after the electromotive force is removed. This shows that the memory structure exhibits non-volatile behaviour which may be used in a memory device.

One embodiment of the present invention is a memory structure for use in a memory device comprising of at least one first layer, wherein:
The first layer comprises at least a plurality of $CeO_2$ nanocubes, and
The memory structure has an electrical resistive state than can be changed in response to an electromotive force being applied thereto.

Another embodiment of the present invention is a memory structure for use in a memory device comprising at least one first layer and at least one second layer, wherein:
At least one first layer comprises a plurality of $CeO_2$ nanocubes, and at least one second layer comprises a plurality of In-doped $CeO_2$ nanocubes, and
The memory structure has an electrical resistive state that can be changed in response to an electromotive force being applied thereto.

Another embodiment of the present invention is a memory structure for use in a memory device comprising three layers, wherein:
a first layer comprises a plurality of $CeO_2$ nanocubes, a second layer comprises a plurality of In-doped $CeO_2$ nanocubes, and a third layer comprises a plurality of $CeO_2$ nanocubes, and
the memory structure has an electrical resistive state that can be changed in response to an electromotive force being applied thereto.

Another embodiment of the present invention is a memory structure for use in a memory device comprising three layers, wherein:
a first layer comprises a plurality of In-doped $CeO_2$ nanocubes, a second layer comprises a plurality of $CeO_2$ nanocubes, and a third layer comprises a plurality of In-doped $CeO_2$ nanocubes, and
the memory structure has an electrical resistive state that can be changed in response to an electromotive force being applied thereto.

Another embodiment of the present invention is a memory structure for use in a memory device comprising at least two or more pairs of layers, wherein:
each pair of layers comprises a layer comprising a plurality of $CeO_2$ nanocubes, and a layer comprising a plurality of In-doped $CeO_2$ nanocubes, and
the memory structure has an electrical resistive state that can be changed in response to an electromotive force being applied thereto.

Figure 30:
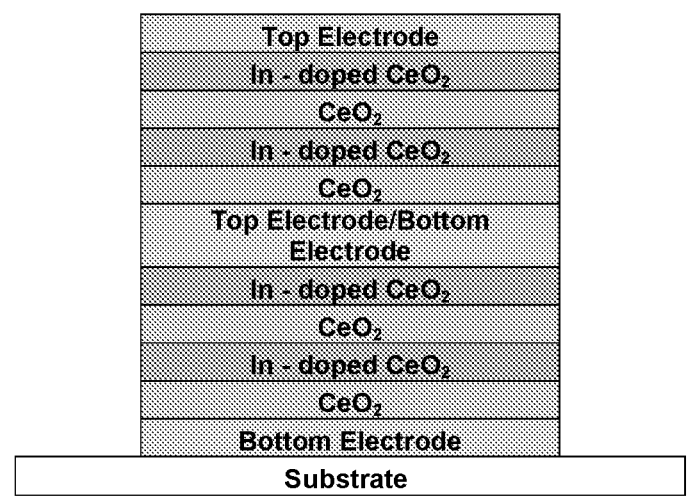
FIG. 30 illustrates a stacked memory device.

For example, the memory structure may have three, four, five or six pairs of layers. Entire memory structures as described above could be stacked on top of each other whereby a stacked memory device is realised in that the top electrode forms the bottom electrode of a succeeding memory structure and so on. In some embodiments, the stacked memory device may be arranged in various configurations including but not limited to a crossbar structure. One of the embodiments of a stacked memory device can be seen in FIG. 30.

Each memory structure may be activated individually by applying an electromotive force to the top and bottom electrode of the respective memory structure. Through stacking of the memory structures, higher data storage capacity may be realised.

The memory structure in some embodiments has high transparency, for example 70% to 80% in the visible range for several reasons, including:
1) Cerium oxide is a wide bang gap material, and it is transparent to the visible light.
2) Organic solvent (e.g Toluene) is a transparent solution.
3) Surfactant solution (e.g oleic acid) is a transparent solution.

This high transparency compares well against glass which is typically around 80%. These properties make the memory structure potentially well suited for transparent electronics.

1.4 Example 1: Preparation of Undoped and Doped Nanocubes

Nanocrystals of metal oxides or doped metal oxides, including $CeO_2$ nanocubes or In-doped $CeO_2$ nanocubes, can be prepared by methods known in the art (e.g. the methods disclosed in: Younis, A., Chu, D., Mihail, I., and Li, S., "Interface-Engineered Resistive Switching: $CeO_2$ Nanocubes as High-Performance Memory Cells", *ACS Appl. Mater. Interfaces,* 2013, 5, 9429-9434; and Younis, A., Chu, D., Kaneti, Y. V., and Li, S., "Tuning the surface oxygen concentration of {111} surrounded ceria nanocrystals for enhanced photocatalytic activities", *Nanoscale,* 2016, 8, 378).

$CeO_2$ nanocubes may be prepared using a hydrothermal process using a cerium precursor in an aqueous environment.

Hydrothermal process is generally defined as crystal growth process under high temperature and high pressure water conditions of substances which are insoluble in ordinary temperature and pressure (<100° C., <1 atm). It is considered one of the most effective methods to synthesise morphologically controlled nanoparticles of high purity with high dispersion and narrow size distribution. The crystal growth is performed in an apparatus consisting of a steel pressure vessel called an autoclave.

The cerium precursor may be a water-soluble cerium(III) salt, e.g. cerium(III) nitrate, cerium(III) chloride or cerium (III) sulfate. In preferred embodiments, the cerium precursor is cerium(III) nitrate.

In a typical preparation of $CeO_2$ nanocubes, an aqueous solution of cerium(III) nitrate is added into an autoclave, and then a mixture of toluene and oleic acid (OLA) is added. Subsequently, tert-butylamine is added into the autoclave under an ambient atmosphere. The sealed autoclave is heated at a temperature in the range of about 100° C. to 250° C., preferably 190° C. to 210°, more preferably about 200° C., for about 10-40 hours, e.g. 30-36 hours, and then cooled to room temperature. The upper organic crude layer of the resulting product is centrifuged to separate the $CeO_2$ nanocubes. The $CeO_2$ nanocubes may be washed with an organic solvent (e.g. ethanol) and/or deionized water. Washing the nanocubes reduces the amount of absorbed organic material.

In-doped $CeO_2$ nanocubes may be prepared using a similar method as that described above for $CeO_2$ nanocubes, but incorporating the use of an indium-containing reagent. The indium-containing reagent may be indium nitrate hydrate or indium chloride, and when used in differing amounts, can result in In-doped $CeO_2$ nanocubes having different levels of indium.

In a typical preparation, cerium(III) nitrate aqueous solution and indium nitrate hydrate aqueous solution are added into an autoclave, and then a solution of toluene and oleic acid is added. Subsequently, tert-butylamine is added into the autoclave under an ambient atmosphere. The sealed autoclave is heated at a temperature in the range of about 180° C. to 220°, e.g. about 200° C., for about 30-36 hours and then cooled to room temperature. The upper organic crude layer of the resulting product is centrifuged to separate the In-doped $CeO_2$ nanocubes. The In-doped $CeO_2$ nanocubes may be washed with an organic solvent (e.g. ethanol) and/or deionized water. The In-doped $CeO_2$ nanocubes are dried at elevated temperature (e.g. about 80° C.) for about 24 hours. The product is calcined in air at about 180° C. for 1 h resulting in a solid solution of In-doped $CeO_2$.

1.4.1 Preparation of $CeO_2$ Nanocubes Doped with 5 wt % Indium Using a Hydrothermal Process All starting materials were purchased from Sigma and used without further purification.

15 mL of 16.7 mmol $l^{-1}$ cerium(III) nitrate hexahydrate aqueous solution (0.10 g cerium(III) nitrate hexahydrate) and indium nitrate hydrate aqueous solution were added into a 50 mL autoclave, and then a 15 mL mixed solution of toluene and oleic acid (OLA, 0.6 mL; OLA:Ce 8:1 mol/mol) was added. Subsequently, tert-butylamine (0.15 mL) was added into the autoclave under an ambient atmosphere. The sealed autoclave was heated at 200° C. for 36 h and then cooled to room temperature. The resulting product was isolated by centrifugation (about 4-6 min at 16,000 RPM) and washed three times with ethanol and deionized water, and then dried at 80° C. for 24 h. The product was calcined in air at 180° C. for 1 h resulting in a solid solution of 5 wt % In-doped $CeO_2$ (the size of nanocubes varied from 2-13 nm; most of the nanocubes were about 8-10 nm).

The preparation of 10 wt % In-doped $CeO_2$ nanocubes and 15 wt % In-doped $CeO_2$ nanocubes was carried out using the same procedure described above with suitable weight percentage ratios of cerium(III) nitrate and indium nitrate hydrate.

1.5 Example 2: Preparation of a Dispersion of Undoped or Doped $CeO_2$ Nanocubes Typically, in order to form a layer of self-assembled $CeO_2$ nanocubes or self-assembled In-doped $CeO_2$ nanocubes on an electrode, or on a previous layer or a substrate, a stable dispersion is prepared by dispersing the nanocubes in a liquid medium that is capable of dispersing the nanocubes. The liquid medium can be prepared from any suitable liquid, e.g. from a solvent or a mixture of solvents.

Advantageously, a stable dispersion can facilitate the self-assembly of the nanocubes. In some embodiments, the liquid medium is an organic solvent or a mixture of organic solvents. The organic solvent may, for example, be toluene, ethanol or n-hexane. In preferred embodiments, the organic solvent is toluene. The stable dispersion may, for example, also comprise a surfactant, e.g. oleic acid. The surfactant may be used to tune the degree of self-assembly of the nanocubes.

Typically, the nanocubes are added to an organic solvent and then mixed thoroughly. Mixing and even distribution of nanocubes may be carried out by shaking or, preferably, sonication for a few minutes.

In some embodiments the dispersion is an ink, e.g. a printable ink.

In one embodiment, the dispersion can be used by solution processed techniques (e.g., spin coating, spray coating, printing) to form the memory structure. Modifications to the rheological, solubility and wettability properties of the dispersion can be made to suit a particular solution processed technique. For example, in inkjet printing, jetting characteristics can be can be adjusted by the addition of a surfactant (e.g. oleic acid) and/or solvent (e.g. toluene, ethanol or n-hexane) to the dispersion. Those skilled in the art will readily envisage other modifications to the dispersion within the spirit and scope of this specification.

1.6 Preparation of a Memory Structure Comprising Layers of Undoped Nanocube and Doped Nanocube The memory structure comprising layers may be fabricated by forming layers adjacent to the previous layer. There are a range of methods for depositing a metal oxide layer onto a substrate for use in a memory device. This includes physical and chemical deposition methods such as sputtering, evaporation, chemical vapour deposition (CVD), physical vapour deposition (PVD) and solution processed techniques such as spin coating, spray coating, drop coating, inkjet printing and other printing techniques and gravure.

A stacked memory device may be fabricated using deposition methods including but not limited to: physical and chemical deposition methods such as sputtering, evaporation, chemical vapour deposition (CVD), physical vapour deposition (PVD) and solution processed techniques such as spin coating, spray coating, drop coating, inkjet printing and other printing techniques and gravure.

1.6.1 Drop Coating Method

One way of depositing a metal oxide layer is through the drop-coating method. The drop-coating method involves putting one or two drops of a dispersion of undoped or doped nanocubes (typically one drop is equilibrium to about 100 µL) on an electrode, or onto a previous layer of doped or undoped nanocubes. Residual amount of oleic acid absorbed on the nanocubes facilitates the self-assembly of the nanocubes in the layer. Typically, the layer is allowed to dry naturally and then treated with ultra-violet radiation, for about 1 h before the next layer is formed.

1.6.2 Spin Coating Method

In an alternative fabrication method, spin coating techniques are used to deposit layers of self-assembled metal oxide nanocubes.

A small amount of the dispersion is put onto the substrate or previous layer. The substrate or previous layer is then rotated at high speed in order to spread the coating material by centrifugal force. Rotation is continued while some of the dispersion spins off the edges of the substrate, until the desired thickness of the film is formed by the residual dispersion. Typically, the layer is allowed to dry naturally and then treated with ultra-violet radiation, for about 1 h before the next layer is formed. Thin and uniform layers can be produced by spin coating method.

1.6.3 Inkjet Printing Method

In an alternative fabrication method, inkjet printing techniques are used to deposit layers of self-assembled metal oxide nanocubes.

A certain amount of the dispersion is put into a printing head in an inkjet printer. The dispersion is then deposited through the inkjet nozzle onto the substrate or previous layer. Typically, the layer is allowed to dry naturally and then treated with ultra-violet radiation for about 1 h before the next layer is formed. Thin and uniform layers can be produced using inkjet printing method.

1.6.4 Other Methods

Those skilled in the art will readily envisage other methods of depositing a metal oxide layer within the spirit and scope of this specification. For example, physical vapour deposition (PVD), chemical vapour deposition (CVD), molecular beam epitaxy (MBE), nanoimprint, ink-jet printing, spray printing, intaglio printing, screen printing, flexographic printing, offset printing, stamp printing, gravure printing, aerosol jet, thermal and laser-induced processes.

1.6.5 Electrodes

In an embodiment of the memory structure, the layers are fabricated on a substrate on which an electrode can be deposited.

The electrodes may be a conducting or semiconducting material, which generally can be applied from solid or liquid phase by a wide range of physical and chemical means. Conductive and semi conductive materials can be suspended or dissolved to form inks, e.g. based on conductive metals (e.g. silver paste), conductive metal alloys, conductive metal oxides, carbon black, semi conductive metal oxides and conductive polymers (e.g. polyaniline, PEDOT).

The electrode may be deposited on the substrate/film by physical and chemical deposition methods or solution processed techniques.

The size of the electrode may be any suitable size depending on the intended application.

The thickness of the electrode may be in the range from several nanometers to several hundred micrometers.

1.6.6 Substrates

The memory structure prepared using the methods 1.6.1 to 1.6.4 above can be used on a range of substrates including glass, plastic, silicon and other materials that provide a suitable surface for depositing a layer of metal oxides nanocubes.

The thickness of the substrate may be in any suitable thickness depending on intended purpose. The thickness of the substrate may, for example, be about 25 µm to about 5 mm.

Those skilled in the art will readily envisage other suitable substrate materials to deposit the memory structure on within the spirit and scope of this specification.

1.6.7 Example 3: Fabrication of a Memory Structure with Layers and Electrodes Nanocubes were prepared as described in section 1.4 were added to toluene. The resulting dispersion was sonicated for about 5 min to ensure even dispersion of nanocubes in toluene.

The dispersion was drop-coated a number of times to obtain self-assembled undoped and doped $CeO_2$ nanocubes based film. The film was treated with ultraviolet radiation for 1 h after every drop-coating to eliminate all organics/extra OLA. The film was finally thermally annealed at 200° C. for 2 h under vacuum. A small area of the electrode (gold, Au) with round patterning and size of about 250 µm diameter was sputtered through a shadow mask to complete the fabrication process.

2. Memory Structure Using $CeO_2$ Nanocubes or In-doped $CeO_2$ Nanocubes Layer and Resistive Properties Examples 4 to 8 described below relate to memory structures including layers of $CeO_2$ nanocubes and layers of In-doped $CeO_2$ nanocubes fabricated using drop coating method as described in Section 1.6.1 on silicon substrates. Example 9 described below relate to a memory structure including layers of $CeO_2$ nanocubes and layers of In-doped $CeO_2$ nanocubes fabricated using inkjet printing method as described in Section 1.6.3 on silicon substrate. Example 10 described below relate to a memory structure including layers of $CeO_2$ nanocubes and layers of In-doped $CeO_2$ nanocubes fabricated using spin coating method as described in Section 1.6.2 on glass substrate. Examples 11 and 12 described below relate to memory structures including layers of $CeO_2$ nanocubes and layers of In-doped $CeO_2$ nanocubes fabricated using spin coating method as described in Section 1.6.2 on silicon substrates. Memory structures using layers of nanocubes have resistive states for both positive and negative voltages on the I-V curve. In the examples below, while resistive states for both positive and negative voltages on the I-V curve can be observed, only those corresponding to positive voltages have been discussed.

2.1 Example 4: Memory Device—Drop Coated on Silicon with $CeO_2$ Single Layer

2.1.1 Memory Device with $CeO_2$ Single Layer—Memory Structure

Figure 2:
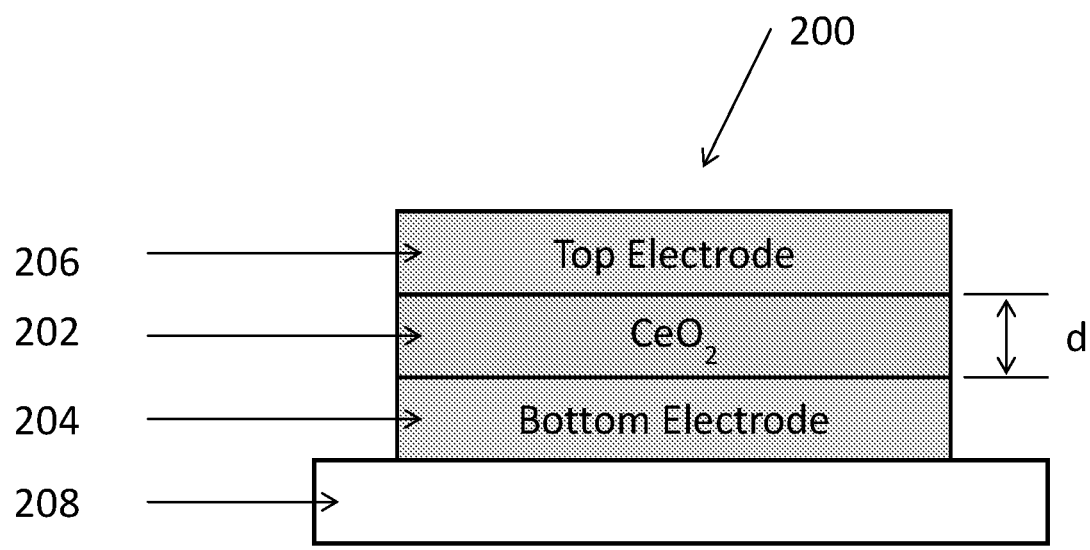
FIG. 2 is an illustration of $CeO_2$ nanocube memory device 200 drop coated on silicon.

FIG. 2 provides a side profile view of an embodiment of a memory device 200 consisting of a single layer of $CeO_2$.

Memory device 200 includes a single layer of cerium(IV) oxide ($CeO_2$) nanocubes 202. The thickness of the $CeO_2$ nanocube layer is around 100 nm. As discussed above, the layer comprises one or more array of cerium(IV) oxide nanocubes.

Memory device 200 includes a bottom electrode 204 and a top electrode 206. The electrodes are gold (Au) electrodes. The bottom gold electrode 204 has a thickness of around 50 nm. The top electrode has a thickness of around 70 nm. In alternative embodiment, other suitable electrode thickness can be used.

Like typical semiconductors, the memory device 200 also includes a substrate 208, which, in this embodiment, is made from a rigid material such as silicon based material to form a silicon wafer. However, in alternative embodiments of the memory device 200, the substrate 208 can be made from other suitable materials including flexible materials such as plastic or other materials such as glass.

The substrate layer 208 is of a thickness that is micrometer in scale and can be whatever thickness is suitable for the intended purpose.

It is envisaged that in alternative embodiments of the memory device 200 the top electrode 206 can be made from other suitable materials. In relation to the bottom electrode 204 can be made from a range of different materials including, but not limited to: platinum, iridium, silver, gold or any combination thereof.

The thicknesses of the top electrode 206 and the thickness of the bottom electrode 204 can be changed to other suitable thicknesses in alternative embodiments of the memory device 200.

Figure 3:
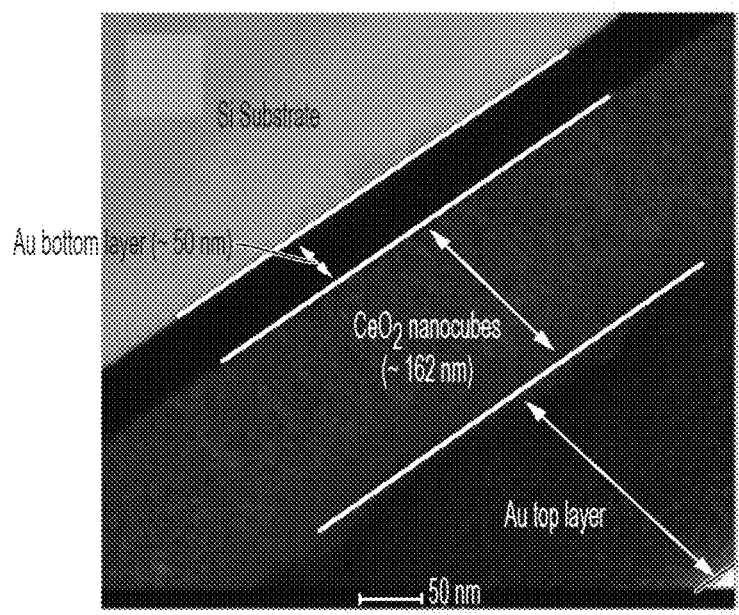
FIG. 3 shows an example of the TEM cross-sectional image of memory device 200, a single layer of $CeO_2$ that is formed with $CeO_2$ nanocubes drop coated on a silicon substrate with top and bottom gold electrodes

FIG. 3 shows an example of the TEM cross-sectional image of a single layer of self-assembled $CeO_2$ nanocubes. In this example, the self-assembled $CeO_2$ nanocubes layer has a thickness of approximately 162 nm. In this figure, the self-assembled $CeO_2$ nanocube layer is sandwiched between a gold top and bottom electrode on a conductive silicon substrate. The layer electrodes, such as Au or other conductive materials, are applied to the top and bottom of the layer, for example on the surface. The layer and electrodes are applied to a substrate, such as silicon, plastic, glass or other materials that provide a suitable surface for depositing a layer of metal oxides nanocubes.

2.1.2 $CeO_2$ Single Layer Memory Device—Method of Manufacture

The description of the drop coating method of manufacture is set out in Section 1.6.1.

2.1.3 $CeO_2$ Single Layer Memory Device—Resistive Properties

Figure 4:
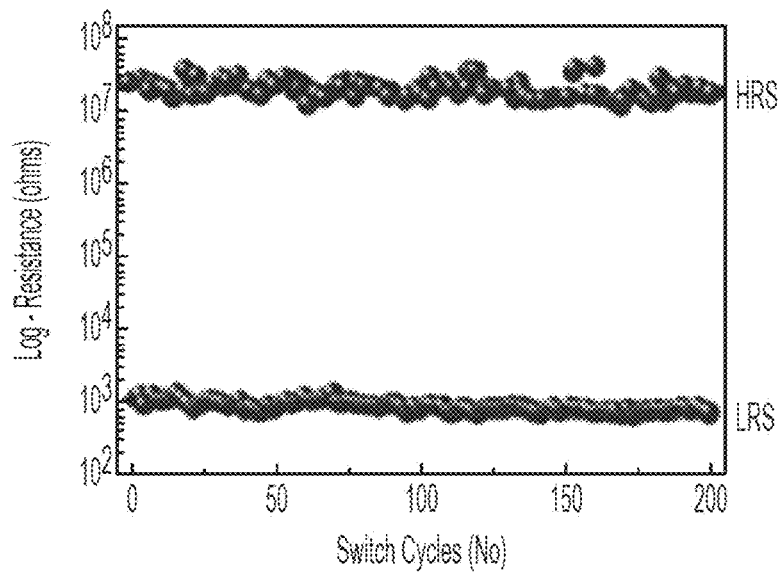
FIG. 4 shows the stability of the electrical resistive states of memory device 200 over multiple ON/OFF cycles.

FIG. 4 shows the resistance states of the memory device 200 at different voltages over multiple ON/OFF cycles. The measurements were performed by applying a voltage across electrodes 204 206. The voltage was varied from 0 volts to +3 V, then +3V to 0 V, then 0 V to −3 V, then −3 V to 0 V, at a rate of +/−0.1 volts per second (V/s). Each time the voltage was varied, the current through memory device 200 was measured and the resistance calculated.

When a change in resistance is observed, either from an OFF resistive state to an ON resistive state or from ON to OFF state, the stability of the resistive state (the ability to retain data) is tested by turning the voltage off and applying a read voltage at which the resistance of the structure is calculated, by measuring the current through the memory device 200. Typically, the read voltage is 0.3 V.

This sequence of steps is a single switching cycle. A calculated resistance value that is repeated over many such cycles is considered stable, and therefore considered to be a resistive state intrinsic to the device.

FIG. 4 shows the resistance of the memory device 200 over 200 switching cycles. The ON/OFF resistive states are shown over multiple (200) switching cycles. In the example of FIG. 4, the OFF resistive state is around $10^7$ ohms and the ON resistive state is around $10^3$ ohms. Both states are retained over 200 switching cycles. Therefore, the ratio of ON/OFF states of a single layer $CeO_2$ memory device is larger than $10^4$. Such a large margin allows the perimeter of a device circuit to identify the information stored in ON and OFF state with extra high accuracy and low noise. Memory device 200 exhibits reversible and reproducible resistive switching behaviour, with high uniformity of the set and reset voltages (Vset, Vreset).

Figure 5:
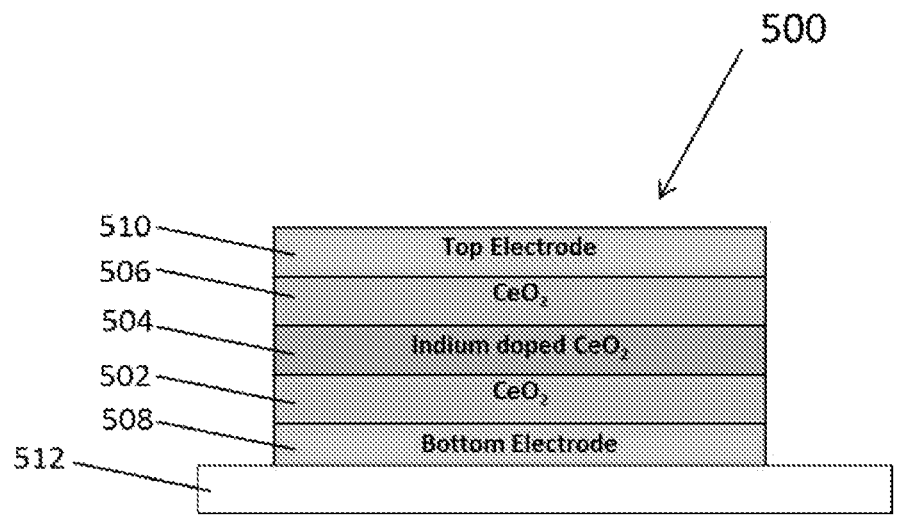
FIG. 5 is an illustration of a multiple layer memory device 500.

2.2 Example 5: Memory Device—Drop Coated on Silicon with Layered $CeO_2$/In-Doped $CeO_2$/$CeO_2$ 2.2.1 Memory Device with Layered $CeO_2$/In-Doped $CeO_2$—Memory Structure FIG. 5 is an illustration of a multiple layer memory device 500. The memory device 500 includes a first layer of $CeO_2$ nanocubes 502, a layer of In-doped $CeO_2$ nanocubes 504, and a second layer of $CeO_2$ nanocubes 506. The layer of In-doped $CeO_2$ nanocubes 504 is sandwiched between the first and second layers of $CeO_2$ nanocubes 502 and 506.

Memory device 500 includes a bottom electrode 508 and a top electrode 510. The electrodes are gold (Au). The bottom electrode is mounted on a silicon substrate 512.

The dimensions of the memory device 500 are approximately 1 cm (W)×1 cm (L).

2.2.2 Memory Device with Layered $CeO_2$/In-Doped $CeO_2$/$CeO_2$—Method of Manufacture The description of the drop coating method of manufacture is set out in Section 1.6.1

Figure 6:
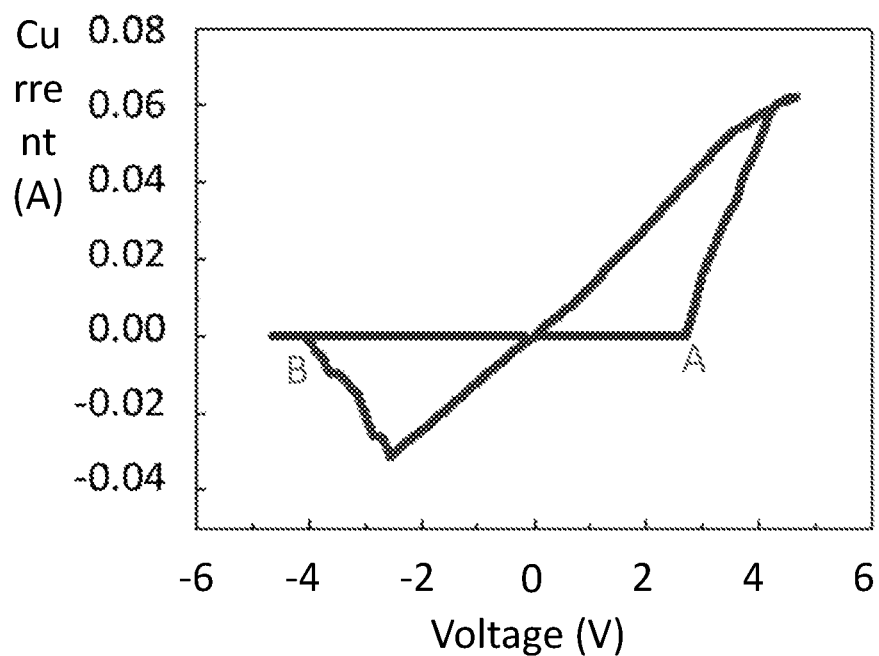
FIG. 6 shows the voltage-current characteristics of the memory device 500 in FIG. 5.

2.2.3 Memory Device with Layered $CeO_2$/In-Doped $CeO_2$/$CeO_2$—Resistive Properties FIG. 6 shows the voltage-current characteristics of the memory device 500 of FIG. 5. The measurement method is the same as described above. Specifically, a voltage is applied across the top and bottom electrodes. The current through memory device 500 is measured during application of the voltage.

Referring now to FIG. 6, an initial voltage of 0.1V is applied to memory device 500 and the current is measured to provide a resistance value. As can be seen from FIG. 6, the gradient of the I-V curve remains relatively constant between 0V and 2.5V. Within this voltage range, memory device 500 has a high resistive state (HRS/OFF) of around $10^7$ ohms.

At 2.5 V the gradient of the I-V curve of memory device 500 changes. As the applied voltage increases from 2.5 V towards 4 V the gradient of the I-V curve remains relatively constant. At around 4 V the memory device 500 has transitioned to a state of low resistance (LRS/ON) of around 100 ohms.

The applied voltage of 2.5 V is the onset voltage for memory device 500, marked as A in FIG. 6.

After reaching voltage of 4 V, the applied voltage is reduced incrementally at a rate of −0.1 V/s. Again, the current through memory device 500 is measured at each applied voltage to determine the resistance of the memory device.

At −4 V (point B on FIG. 6) current drops very close to zero amps. At this point the memory device has switched back into the high resistive state. This is the reset voltage for the memory device 500 at which the memory device 500 is reset from the low to high voltage (HRS/OFF state).

As shown in FIG. 6 memory device 500 has two distinctive resistive states, namely a low resistance ON state, which is activated on application of voltages greater than 2.5 V, and a high resistance OFF state, which is reset on application of voltages below −4 V. Consequently, bipolar reversible resistive switching properties are displayed by the memory device 500. By applying a potential across the electrodes the memory device 500 can be set from high resistive state (HRS/OFF) to low resistive state (LRS/ON). The resistive state of the memory device 500 is reset from LRS to HRS. A suitable voltage range to set and reset the memory device 500 is between −10V to 10V.

By changing the layer structure, tuneable resistive switching properties can be realized. For example, the memory device 500 of FIG. 5 includes a single In-doped $CeO_2$ nanocube layer between two $CeO_2$ nanocube layers. The In-doped layer enables an ON/OFF ratio higher than $2×10^5$ to be obtained.

Figure 7:
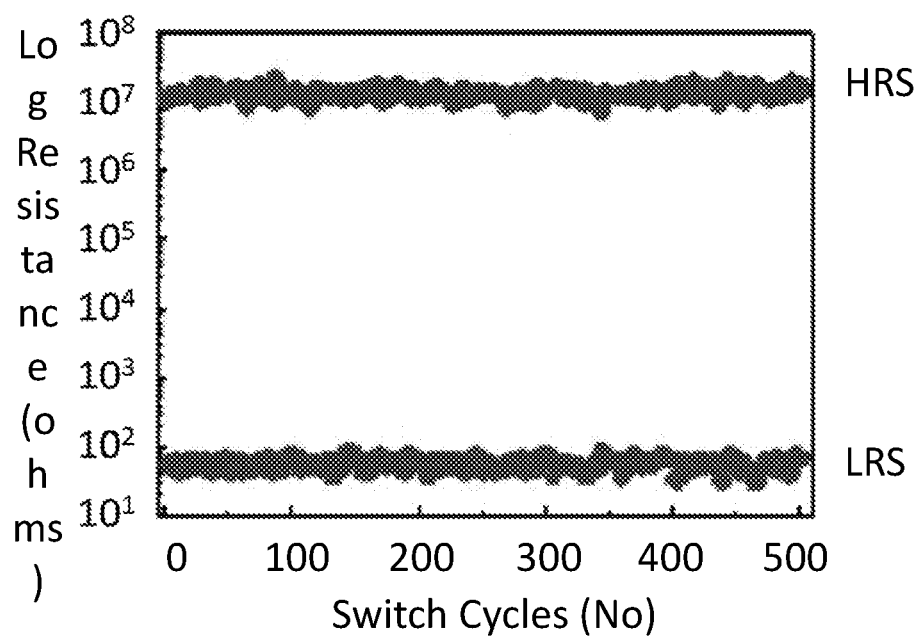
FIG. 7 shows the stability of the resistive states over a number of switching cycles of memory device 500.

FIG. 7 shows the stability of the resistive states over a number of switching cycles. The stability of the resistive states was tested in the same manner as described above in Example 4.

As shown in FIG. 7, the LRS/ON state was maintained stably at a resistive of around 80 ohms over 500 switching cycles. The HRS/OFF state was maintained stably at a resistive state of around $10^7$ ohms over 500 switching cycles.

The additional layer of In-doped $CeO_2$ nanocubes in memory device 500 of FIG. 5 has generated a higher ON/OFF ratio ($10^5$ ohms) compared with the single layer of $CeO_2$ nanocubes memory device 200 of FIG. 2.

Figure 8:
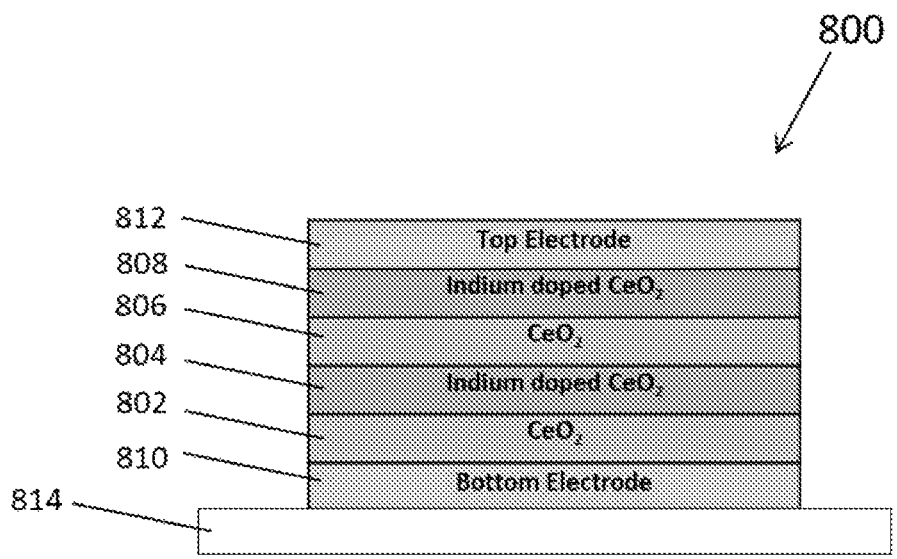
FIG. 8 is an illustration of a further multiple layer memory device 800.

2.3 Example 6: Memory Device—Drop Coated on Silicon with Two Pairs of $CeO_2$/In-Doped $CeO_2$ Layers 2.3.1 Memory Device with Two Pairs of $CeO_2$/In-Doped $CeO_2$ Layers—Memory Structure FIG. 8 is an illustration of a further multiple layer memory device 800. The memory device includes a first layer of $CeO_2$ nanocubes 802, a first layer of In-doped $CeO_2$ nanocubes 804, a second layer of $CeO_2$ nanocubes 806, and a second layer of In-doped $CeO_2$ nanocubes 808.

Memory device 800 includes a bottom electrode 810 and a top electrode 812. The electrodes are gold (Au). The bottom electrode is mounted on a silicon substrate 814.

The dimensions of memory device 800 are approximately 1 cm (W)×1 cm (L).

2.3.2 Memory Device with Two Pairs of $CeO_2$/In-Doped $CeO_2$ Layers—Method of Manufacture The description of the drop coating method of manufacture is set out in Section 1.6.1

Figure 9:
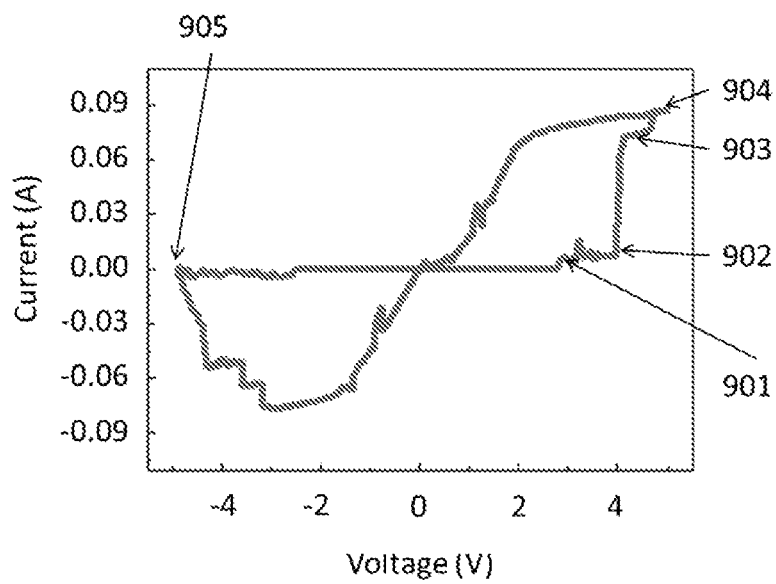
FIG. 9 shows the voltage-current characteristics of the memory device 800 in FIG. 8.

2.3.3 Memory Device with Two Pairs of $CeO_2$/In-Doped $CeO_2$ Layers—Resistive Properties FIG. 9 shows the voltage-current characteristics of the memory device 800 of FIG. 8. The measurement method is the same as described above. Specifically, a voltage is applied across the top and bottom electrodes. The current through the memory device 800 is measured during application of the voltage.

Referring now to FIG. 9, an initial voltage of 0.1V is applied to the memory device 800 and the current is measured to provide a resistance value. As can be seen from FIG. 9, the gradient of the I-V curve remains relatively constant between 0 V and 3 V (represented by 901). Within this voltage range, the memory device 800 has a high resistive state (HRS/OFF) of around $10^7$ ohms.

At 3 V (901) the gradient of the I-V curve changes. The gradient of the I-V curve remains relatively constant until the applied voltage is increased to 4 V (902) and the resistive state of the memory device 800 has transitioned to around $10^5$ ohms.

At 4 V (902) the gradient of the I-V curve changes again. The gradient of the I-V curve remains relatively constant until the applied voltage is increased to 4.2 V (903) and the resistance of the memory device 800 has transitioned to around 100 ohms. This is the low resistive state for memory device 800.

At 4.2 V (903) the gradient of the I-V curve changes again. The gradient of the I-V curve remains relatively constant until the applied voltage is increased to 5 V (904) and the resistance of the memory device 800 increases to around 1000 ohms.

After reaching maximum voltage of 5 V, the applied voltage is reduced incrementally at a rate of −0.1 V/s. Again, the current through the memory device 800 is measured at each applied voltage to calculate resistance of the memory device 800.

At −5 V (905) current drops very close to zero amps. At this point the memory device 800 has switched back into the high resistive state. This is the reset voltage for the memory device 800 at which the memory device 800 is reset from the low to high voltage (HRS/OFF state). The resistance of the high resistive OFF state is around $10^7$ ohms.

Figure 10:
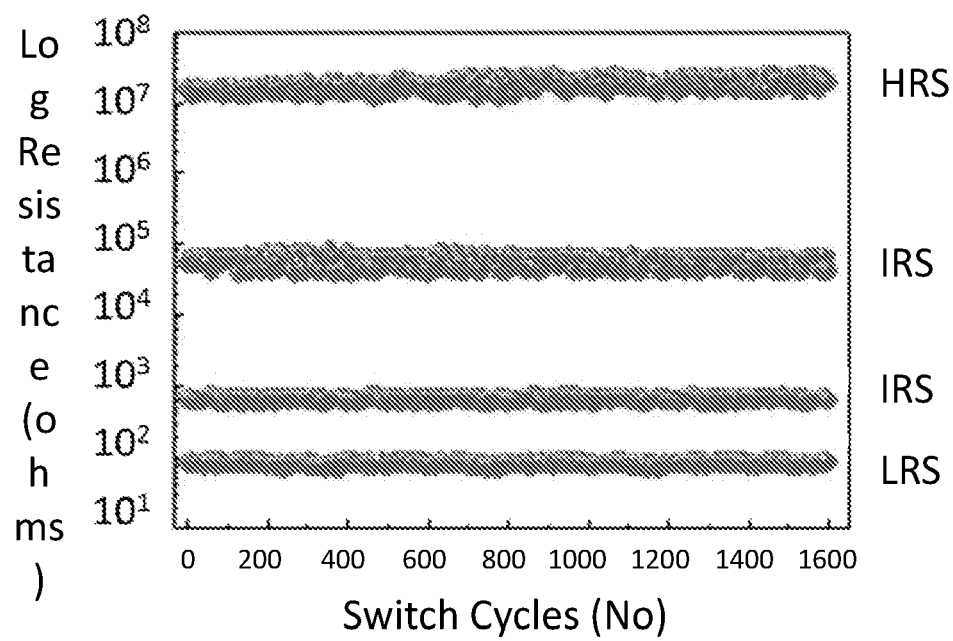
FIG. 10 shows the stability of the electrical resistive states of memory device 800 over multiple ON/OFF cycles.

It is evident from FIG. 10 that the memory device 800 has four distinctive resistive states, namely:
 a low resistive ON state having a resistance of around 100 ohms, which is activated by applied voltages between 4.0 V to 4.2 V.
 A first intermediate resistive state having a resistance of around 1000 ohms, which is activated by applied voltages between 4.2 V to 5 V.
 A second intermediate resistive state having a resistance of around $10^5$ ohms, which is activated by applied voltages between 3.0 V to 4.0 V.
 A high resistive OFF state, which is activated by applying a voltage of −5.0 V. The high resistive OFF state for memory device 800 is around $10^7$ ohms.

The intermediate resistive states occur at voltages either side of the LRS/ON state.

Reversible resistive switching properties are displayed by memory device 800. By applying a potential across the electrodes the memory device 800 can be set from high resistive state (HRS/OFF) to low resistive state (LRS/ON). Additionally two intermediate states are exhibited by memory device 800. A suitable voltage range to set and reset memory device 800 is between −10V to 10V.

FIG. 10 shows the stability of the resistive states of memory device 800 over a number of switching cycles. The stability of the resistive states was tested in the same manner as described above in Example 4.

As evident from FIG. 10, the LRS/ON state was maintained stably at a resistance of around 100 ohms over 1600 switching cycles. The HRS/OFF state was maintained stably at a resistance of around $10^7$ ohms over 1600 switching cycles. Additionally, memory device 800 exhibited two intermediate resistive states at around 100 ohms and at around $10^6$ ohms. Both intermediate states were maintained stably over 1600 switching cycles.

Again, by changing the layer structure, tuneable resistive switching properties can be realized. For example, the memory device 800 of FIG. 8 includes two $CeO_2$/In-doped $CeO_2$ layer pairs and exhibits four distinctive resistive states in FIG. 10.

Figure 11:
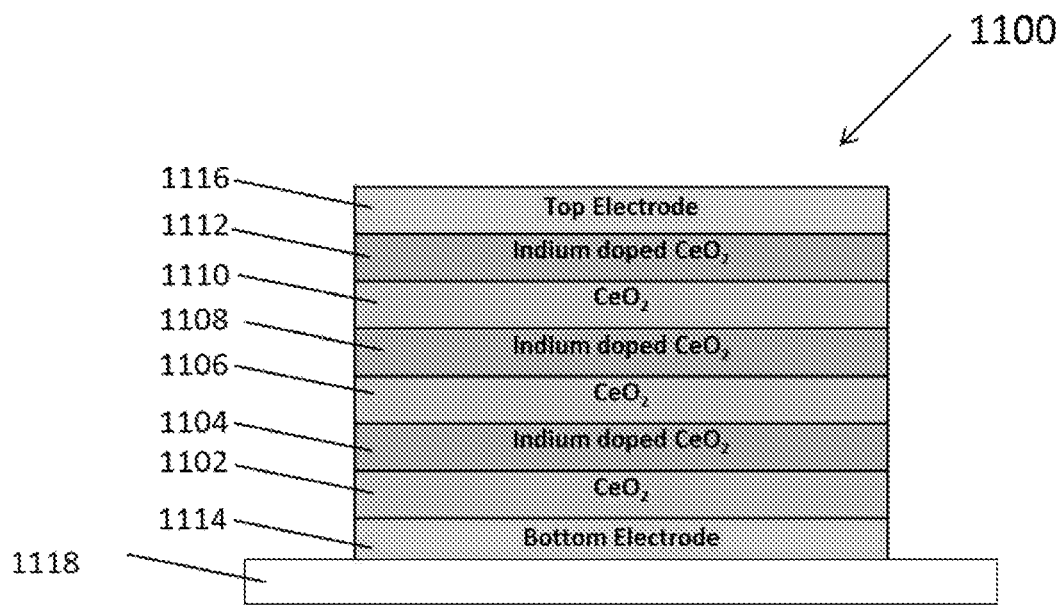
FIG. 11 is an illustration of a further multiple layer memory device 1100.

2.4 Example 7: Memory Device—Drop Coated on Silicon with Three Pairs of $CeO_2$/In-Doped $CeO_2$ Layers 2.4.1 Memory Device with Three Pairs of $CeO_2$/In-Doped $CeO_2$ Layers—Memory Structure FIG. 11 is an illustration of a further multiple layer memory device 1100. The memory device 1100 includes a first layer of $CeO_2$ nanocubes 1102, a first layer of In-doped $CeO_2$ nanocubes 1104, a second layer of $CeO_2$ nanocubes 1106, a second layer of In-doped $CeO_2$ nanocubes 1108, a third layer of $CeO_2$ nanocubes 1110, and a third layer of In-doped $CeO_2$ nanocubes 1112. The layers are positioned adjacent to each other in an alternating configuration of $CeO_2$ and In-doped $CeO_2$ layers. Consequently the memory device 1100 includes three $CeO_2$/In-doped $CeO_2$ layer pairs.

Memory device 1100 includes a bottom electrode 1114 and a top electrode 1116. The electrodes are gold (Au). The bottom electrode is mounted on a silicon substrate 1118.

The dimensions of memory device 1100 are 1 cm (W)×1 cm (L).

2.4.2 Memory Device with Three Pairs of $CeO_2$/In-Doped $CeO_2$ Layers—Method of Manufacture The description of the drop coating method of manufacture is set out in Section 1.6.1

Figure 12:
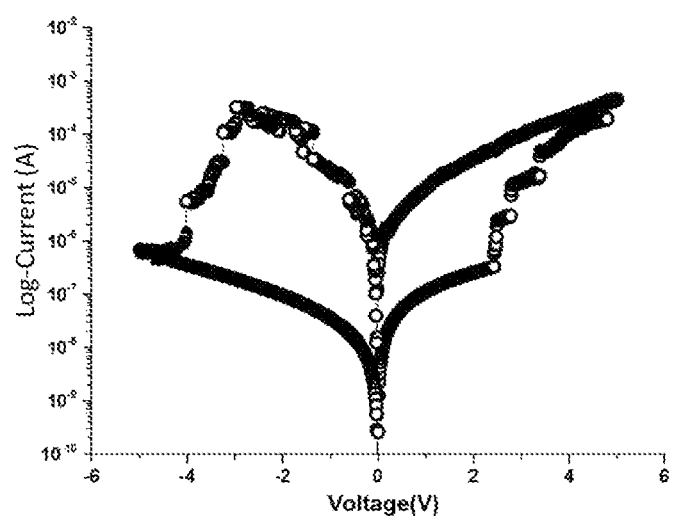
FIG. 12 shows the voltage-logarithmic current characteristics of memory device 1100 of FIG. 11.

2.4.3 Memory Device with Three Pairs of $CeO_2$/In-Doped $CeO_2$ Layers—Resistive Properties FIG. 12 shows the voltage-logarithmic current characteristics of the memory device 1100 of FIG. 11. The measurement method is the same as described above.

Specifically, a voltage is applied across the top and bottom electrodes. The current through the memory device 1100 is measured during application of the voltage.

Referring now to FIG. 12, an initial voltage of 0.1V is applied to the memory device 1100 and the current is measured to provide a resistive value. As can be seen from FIG. 12, the gradient of the I-V curve remains relatively constant between 0 V and 3 V. Within this voltage range, the memory device 1100 has a high resistive state (HRS/OFF) in the range of $10^7$ ohms.

Figure 13:
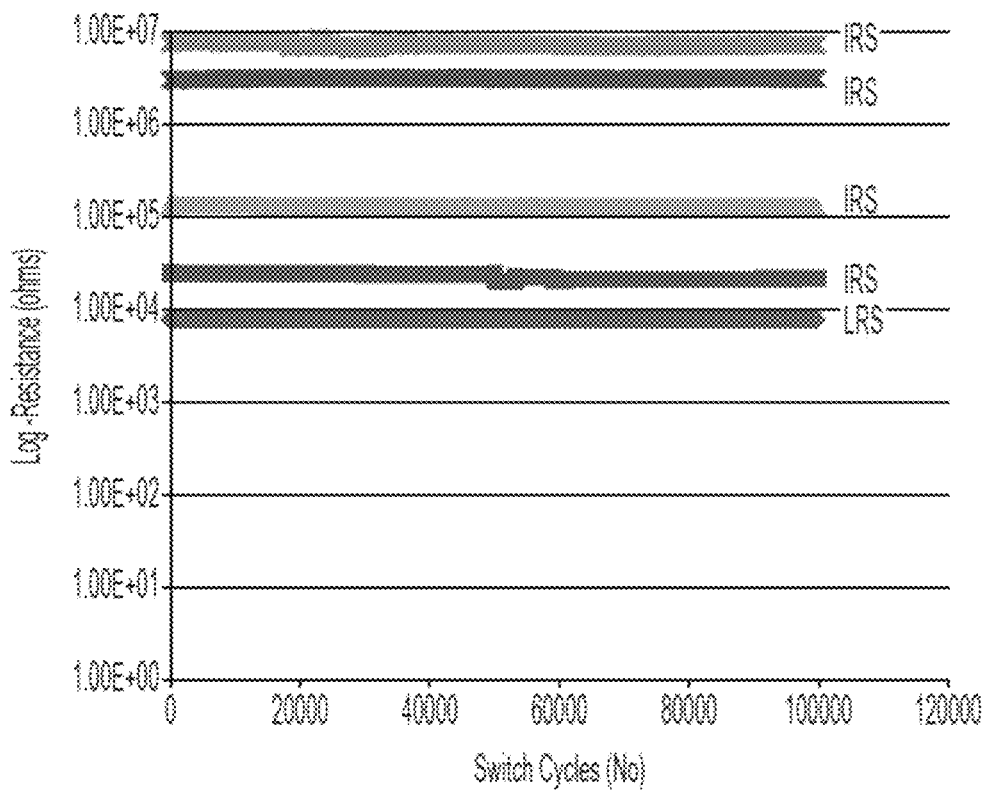
FIG. 13 shows the stability of the electrical resistive states of memory device 1100 over multiple ON/OFF cycles.

It is evident that memory device 1100 in FIG. 11 has five distinctive resistive states as illustrated in FIG. 13.

Reversible resistive switching properties are displayed by memory device 1100. By applying a potential across the electrodes the device can be set from the high resistive state (HRS/OFF) to the low resistive state (LRS/ON). Additionally three intermediate resistive states are exhibited by memory device 1100. A suitable voltage range to set and reset the memory device 1100 is between −10V to 10V.

FIG. 13 shows the stability of the five resistive states of memory device 1100 over a number of switching cycles. The stability of the resistive states was tested in the same manner as described above in Example 4.

As evident from FIG. 13, the LRS/ON state was maintained stably at a resistance of around $10^4$ ohms over 100,000 switching cycles. The HRS/OFF state was maintained stably at a resistance of around $10^7$ ohms over 100,000 switching cycles. Additionally, memory device 1100 exhibited three intermediate resistive states at around 100 ohms, 1000 ohms and at around $10^4$ ohms. All three intermediate states were maintained stably over 100,000 switching cycles.

Again, by changing the layer structure, tuneable resistive switching properties can be realized. For example, the memory device 1100 of FIG. 11 includes three $CeO_2$/In-doped $CeO_2$ layer pairs and exhibits five distinctive resistive states in FIG. 13.

Figure 14:
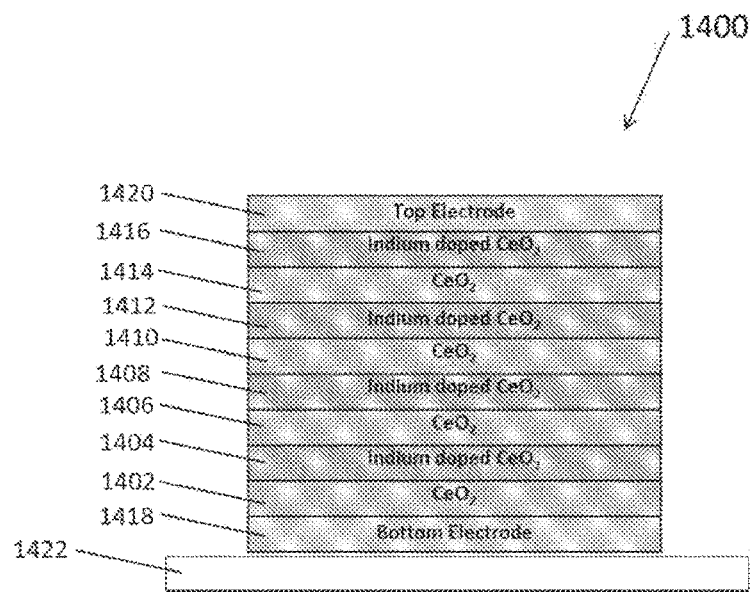
FIG. 14 is an illustration of a further multiple layer memory device 1400.

2.5 Example 8: Memory Device—Drop Coated on Silicon with Four Pairs of $CeO_2$/In-Doped $CeO_2$ Layers 2.5.1 Memory Device with Four Pairs of $CeO_2$/In-Doped $CeO_2$ Layers—Memory Structure FIG. 14 is an illustration of a further multiple layer memory device 1400. The memory device 1400 includes a first layer of $CeO_2$ nanocubes 1402, a first layer of In-doped $CeO_2$ nanocubes 1404, a second layer of $CeO_2$ nanocubes 1406, a second layer of In-doped $CeO_2$ nanocubes 1408, a third layer of $CeO_2$ nanocubes 1410, a third layer of In-doped $CeO_2$ nanocubes 1412, a fourth layer of $CeO_2$ nanocubes 1414, and a fourth layer of In-doped $CeO_2$ nanocubes 1416. The layers are positioned adjacent to each other in an alternating configuration. Consequently the memory device 1400 includes four $CeO_2$/In-doped $CeO_2$ layer pairs.

Memory device 1400 includes a bottom electrode 1418 and a top electrode 1420. The electrodes are gold (Au). The bottom electrode is mounted on a silicon substrate 1422.

The dimensions of memory device 1400 are 1 cm (W)×1 cm (L).

2.5.2 Memory Device with Four Pairs of $CeO_2$/In-Doped $CeO_2$ Layers—Method of Manufacture The description of the drop coating method of manufacture is set out in Section 1.6.1

Figure 15:
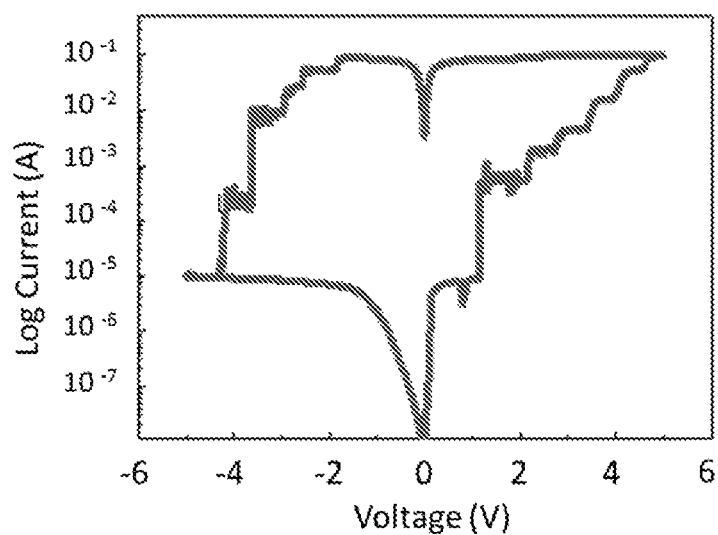
FIG. 15 shows the voltage-logarithmic current characteristics of memory device 1400 in FIG. 14.

2.5.3 Memory Device with Four Pairs of $CeO_2$/In-Doped $CeO_2$ Layers—Resistive Properties FIG. 15 shows the voltage-current characteristics of the memory device 1400 of FIG. 14. The measurement method is the same as described above. Specifically, a voltage is applied across the top and bottom electrodes. The current through the memory device 1400 is measured during application of the voltage.

Referring now to FIG. 15, an initial voltage of 0.1V is applied to the memory device 1400 and the current is measured to provide a resistance value.

Figure 16:
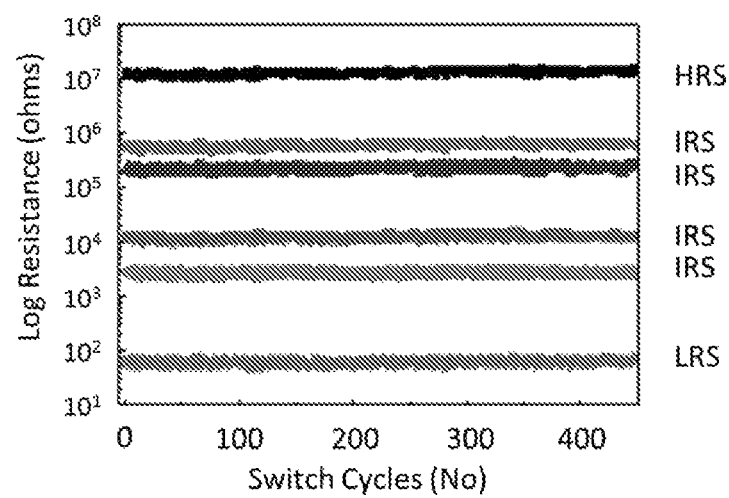
FIG. 16 shows the stability of the electrical resistive states of memory device 1400 over multiple ON/OFF cycles.

It is evident that memory device 1400 in FIG. 14 exhibits six distinctive resistive states in FIG. 16.

Reversible resistive switching properties are displayed by memory device 1400. By applying a potential across the electrodes the device can be set from the high resistive state (HRS/OFF) to the low resistive state (LRS/ON). Additionally four intermediate states are exhibited by memory device 1400. A suitable voltage range to set and reset the memory device is between −10V to 10V.

Figure 17:
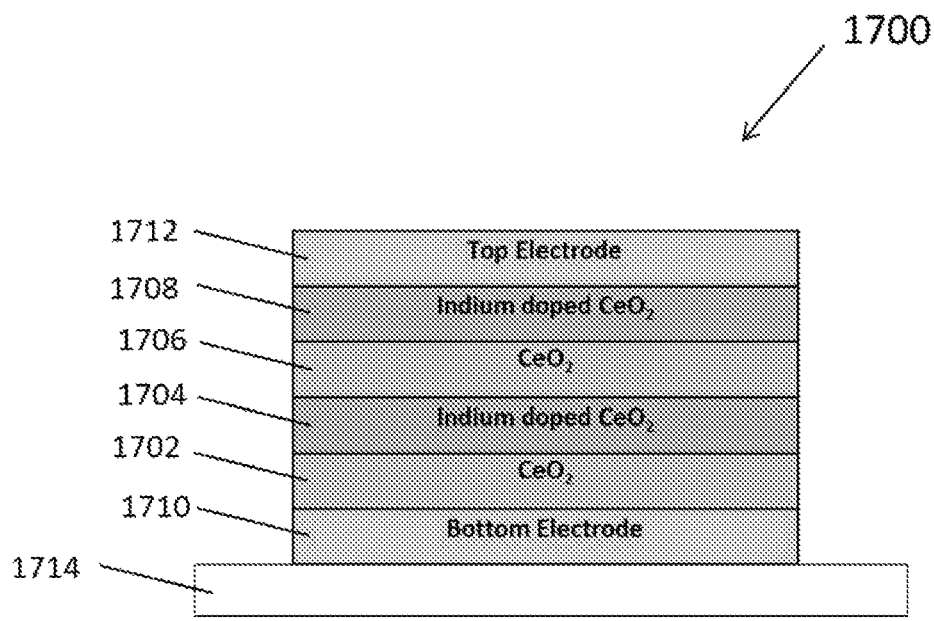
FIG. 17 is an illustration of a further multiple layer memory device 1700

FIG. 17 shows the stability of the six resistive states of memory device 1400 over a number of switching cycles. The stability of the resistive states was tested in the same manner as described above in Example 4.

As shown in FIG. 16, the LRS/ON state was maintained stably at a resistance of around 50 ohms over 450 switching cycles. The HRS/OFF state was maintained stably at a resistance of around $10^7$ ohms over 450 switching cycles. Additionally, memory device 1400 exhibited four intermediate resistive states at around 1,000 ohms, 10,000 ohms, $10^5$ ohms and at around $10^6$ ohms. All four intermediate resistive states were maintained stably over 450 switching cycles.

Again, by changing the layer structure, tuneable resistive switching properties can be realized. For example, the memory device 1400 of FIG. 14 includes four layer pairs of $CeO_2$ nanocubes/In-doped $CeO_2$ nanocubes and exhibits six distinctive resistive states in FIG. 16.

2.6 Example 9: Memory Device—Inkjet Printed on Silicon with Two Pairs of $CeO_2$/In-Doped $CeO_2$ Layers 2.6.1 Memory Device with Two Pairs of $CeO_2$/In-Doped $CeO_2$ Layers—Memory Structure FIG. 17 is an illustration of a further multiple layer memory device 1700. The memory device includes a first layer of $CeO_2$ nanocubes 1702, a first layer of In-doped $CeO_2$ nanocubes 1704, a second layer of $CeO_2$ nanocubes 1706, and a second layer of In-doped $CeO_2$ nanocubes 1708.

Memory device 1700 includes a bottom electrode 1710 and a top electrode 1712. The electrodes are gold (Au). The bottom electrode is mounted on a silicon substrate 1714.

The dimensions of memory device 1700 are approximately 1 cm (W)×1 cm (L).

2.6.2 Memory Device with Two Pairs of $CeO_2$/In-Doped $CeO_2$ Layers—Method of Manufacture The description of the inkjet printing method of manufacture is set out in Section 1.6.3

Figure 18:
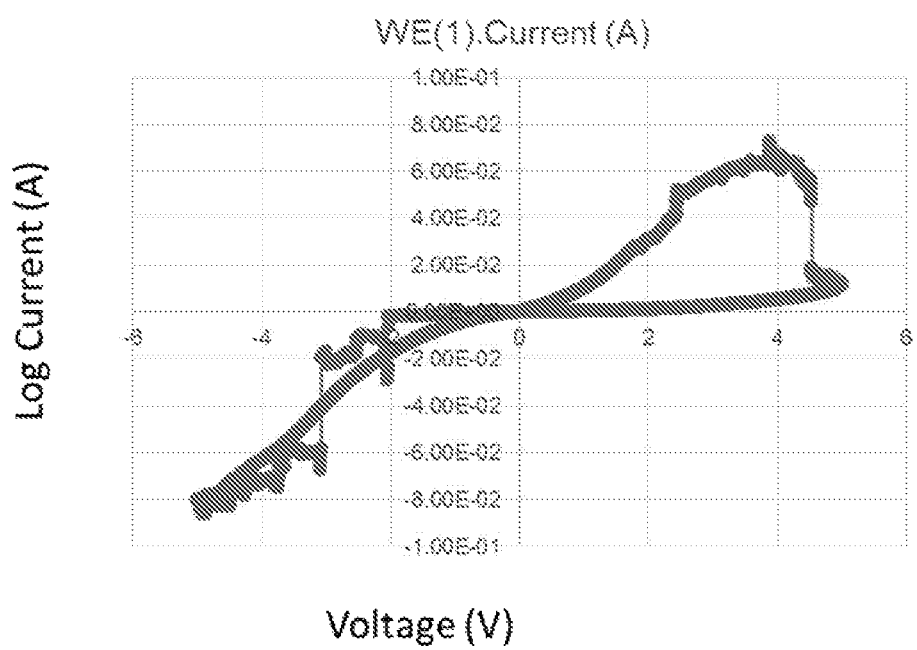
FIG. 18 shows the voltage-logarithmic current characteristics of the memory device 1700 in FIG. 17

2.6.3 Memory Device with Two Pairs of $CeO_2$/In-Doped $CeO_2$ Layers—Resistive Properties FIG. 18 shows the voltage-log current characteristics of the memory device 1700 of FIG. 17. The measurement method is the same as described above. Specifically, a voltage is applied across the top and bottom electrodes. The current through the memory device 1700 is measured during application of the voltage.

Referring now to FIG. 18, an initial voltage starting from −0.1V is applied to the memory device 1700 and the current is measured continuously to provide a resistance value. As can be seen from FIG. 18, the gradient of the I-V curve remains relatively constant between 0 V and −2V. Within this voltage range, the memory device 1700 has a high resistive state (HRS/OFF) of around $10^5$ ohms.

Figure 19:
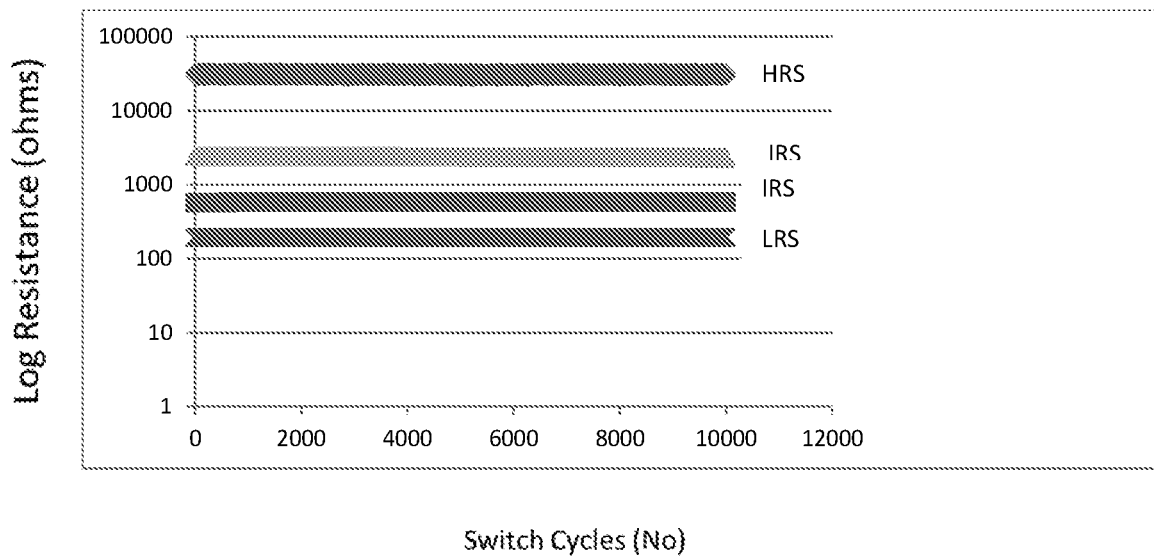
FIG. 19 shows the stability of the electrical resistive states of memory device 1700 over multiple ON/OFF cycles

It is evident from FIG. 19 that the memory device 1700 has four distinctive resistive states.

Reversible resistive switching properties are displayed by memory device 1700. By applying a negative potential across the electrodes, the device can be set from the high resistive state (HRS/OFF) to the low resistive state (LRS/ON). Four distinct resistive states are exhibited by memory device 1700. A suitable voltage range to set and reset the memory device 1700 is between −5V to 5V.

FIG. 19 shows the stability of the four resistive states of memory device 1700 over 10,000 switching cycles. The stability of the resistive states was tested in the same manner as described above in Example 4.

As evident from FIG. 19, the LRS/ON state was maintained stably at a resistance of around 150 ohms over 10,000 switching cycles. The HRS/OFF state was maintained stably at a resistive between $10^4$ and $10^5$ ohms over 10,000 switching cycles. Additionally, memory device 1700 exhibited two intermediate resistive states at around 1000 ohms and at around 5000 ohms. All two intermediate states were maintained stably over 10,000 switching cycles.

Again, by changing the layer structure, tuneable resistive switching properties can be realized. For example, the memory device 1700 of FIG. 17 includes two $CeO_2$/In-doped $CeO_2$ layer pairs and exhibits four distinctive resistive states in FIG. 19.

Figure 20:
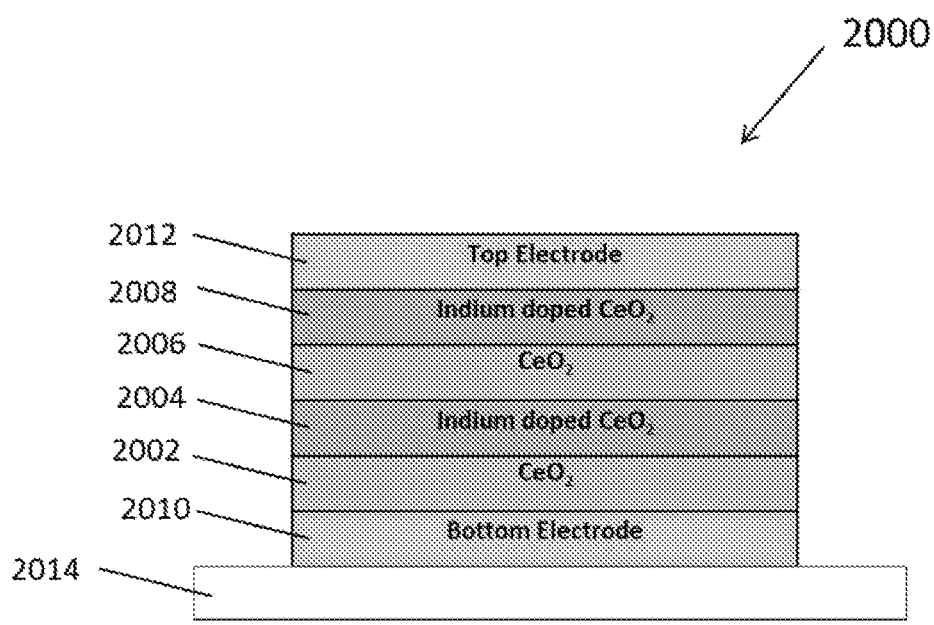
FIG. 20 is an illustration of a further multiple layer memory device 2000.

2.7 Example 10: Memory Device—Spin Coated on F-Doped $SnO_2$(FTO) Glass with Two Pairs of $CeO_2$/In-Doped $CeO_2$ Layers 2.7.1 Memory Device with Two Pairs of $CeO_2$/In-Doped $CeO_2$ Layers—Memory Structure FIG. 20 is an illustration of a further multiple layer memory device 2000. The memory device 2000 includes a first layer of $CeO_2$ nanocubes 2002, a first layer of In-doped $CeO_2$ nanocubes 2004, a second layer of $CeO_2$ nanocubes 2006, a second layer of In-doped $CeO_2$ nanocubes 2008. The layers are positioned adjacent to each other in an alternating configuration of $CeO_2$ and In-doped $CeO_2$ layers. Consequently, the memory device 2000 includes two $CeO_2$/In-doped $CeO_2$ layer pairs.

Memory device 2000 includes a bottom electrode 2010 and a top electrode 2012. The top electrode is silver(Ag). The bottom electrode is FTO which was mounted on a glass substrate 2014.

The dimensions of memory device 2000 are 1 cm (W)×1 cm (L).

2.7.2 Memory Device with Two Pairs of $CeO_2$/In-Doped $CeO_2$ Layers—Method of Manufacture The description of the spin coated method of manufacture is set out in Section 1.6.2

Figure 21:
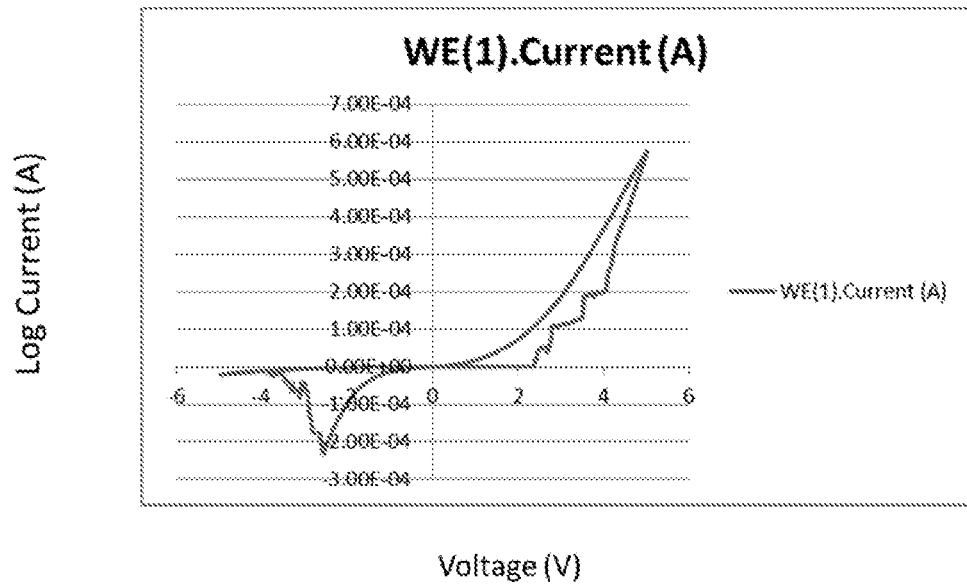
FIG. 21 shows the voltage-logarithmic current characteristics of the memory device 2000 over multiple ON/OFF cycles.

2.7.3 Memory Device with Two Pairs of $CeO_2$/In-Doped $CeO_2$ Layers—Resistive Properties FIG. 21 shows the voltage-current characteristics of the memory device 2000 of FIG. 20. The measurement method is the same as described above. Specifically, a voltage is applied across the top and bottom electrodes. The current through the memory device 2000 is measured during application of the voltage.

Referring now to FIG. 21, an initial voltage of 0.1V is applied to the memory device 2000 and the current is measured to provide a resistance value. As can be seen from FIG. 21, the gradient of the I-V curve remains relatively constant between 0 V and 2.5 V. Within this voltage range, the memory device 2000 has a high resistive state (HRS/OFF) of around $10^7$ ohms.

Figure 22:
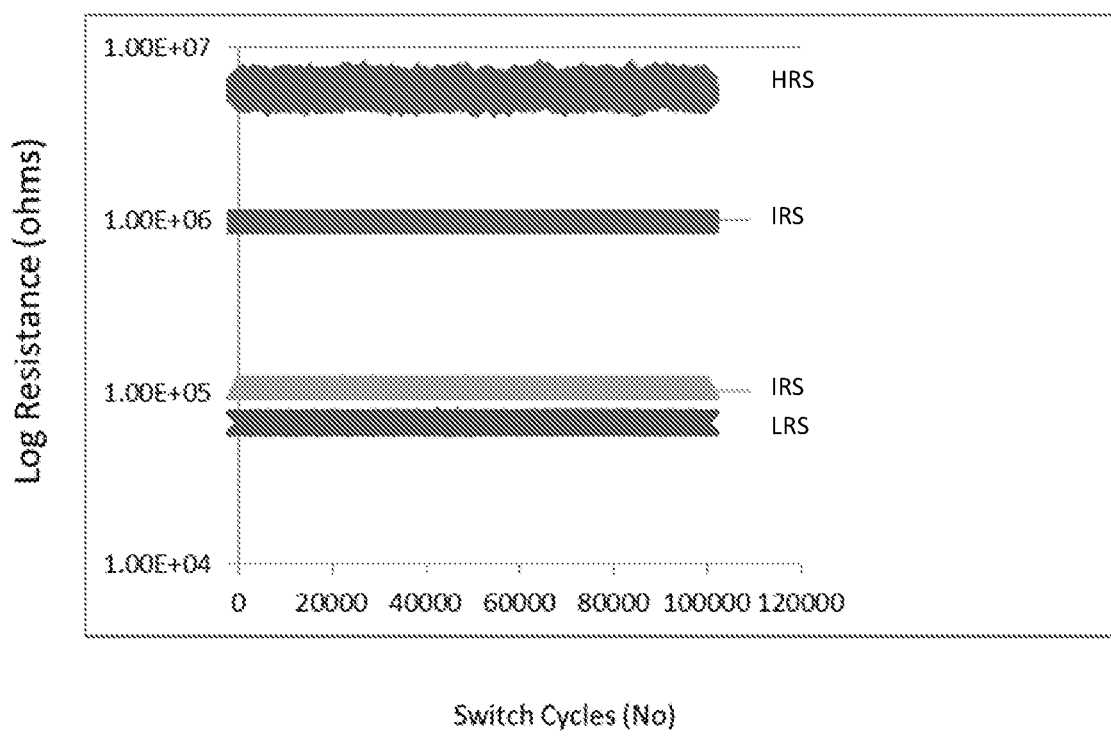
FIG. 22 shows the stability of the electrical resistive states of memory device 2000 over multiple ON/OFF cycles.

It is evident from FIG. 22 that the memory device 2000 has four distinctive resistive states.

Reversible resistive switching properties are displayed by memory device 2000. By applying a potential across the electrodes the device can be set from the high resistive state (HRS/OFF) to the low resistive state (LRS/ON). Additionally two intermediate resistive states are exhibited by memory device 2000. A suitable voltage range to set and reset the memory device 2000 is between −6V to 6V.

FIG. 22 shows the stability of the four resistive states of memory device 2000 over 100,000 switching cycles. The stability of the resistive states was tested in the same manner as described above in Example 4 however using a read voltage of 0.5 V.

As evident from FIG. 22, the LRS/ON state was maintained stably at a resistance of around 70000 ohms over 100,000 switching cycles. The HRS/OFF state was maintained stably at a resistance of around $10^7$ ohms over 100,000 switching cycles. Additionally, memory device 2000 exhibited two intermediate resistive states at around $10^5$ ohms, and at around $10^6$ ohms. All two intermediate resistive states were maintained stably over 100,000 switching cycles.

Again, by changing the layer structure, tuneable resistive switching properties can be realized. For example, the memory device 2000 of FIG. 20 includes two $CeO_2$/In-doped $CeO_2$ layer pairs and exhibits four distinctive resistive states in FIG. 22.

Figure 23:
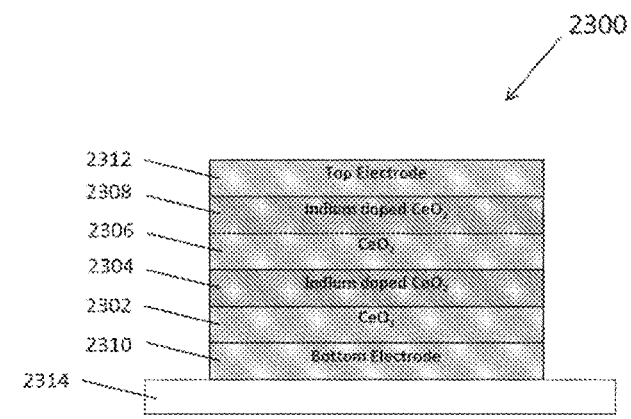
FIG. 23 is an illustration of a further multiple layer memory device 2300.

2.8 Example 11: Memory Device—Spin Coated on Silicon with Two Pairs of $CeO_2$/In-Doped $CeO_2$ Layers 2.8.1 Memory Device with Two Pairs of $CeO_2$/In-Doped $CeO_2$ Layers—Memory Structure FIG. 23 is an illustration of a further multiple layer memory device 2300. The memory device includes a first layer of $CeO_2$ nanocubes 2302, a first layer of In-doped $CeO_2$ nanocubes 2304, a second layer of $CeO_2$ nanocubes 2306, and a second layer of In-doped $CeO_2$ nanocubes 2308.

Memory device 2300 includes a bottom electrode 2310 and a top electrode 2312. The electrodes are gold (Au). The bottom electrode is mounted on a silicon substrate 2314.

The dimensions of memory device 2300 are approximately 1 cm (W)×1 cm (L).

2.8.2 Memory Device with Two Pairs of $CeO_2$/In-Doped $CeO_2$ Layers—Method of Manufacture The description of the spin coating method of manufacture is set out in Section 1.6.2

Figure 24:
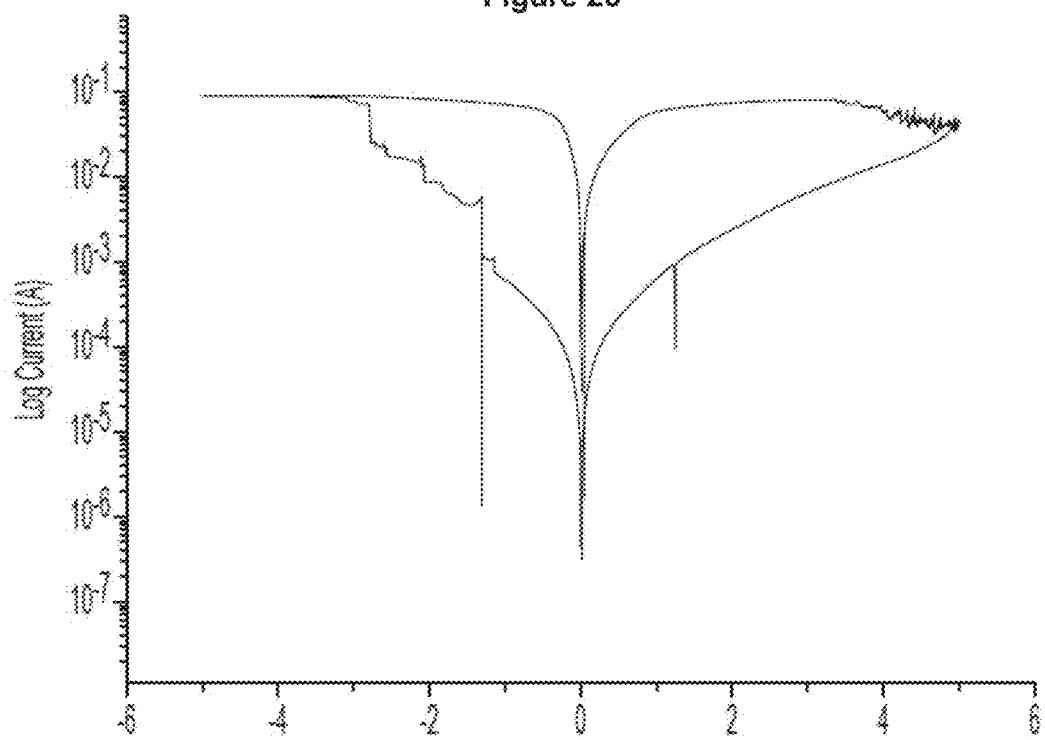
FIG. 24 shows the voltage-logarithmic current characteristics of the memory device 2300 over multiple ON/OFF cycles.

2.8.3 Memory Device with Two Pairs of $CeO_2$/In-Doped $CeO_2$ Layers—Resistive Properties FIG. 24 shows the voltage-logarithmic current characteristics of the memory device 2300 of FIG. 23. The measurement method is the same as described above. Specifically, a voltage is applied across the top and bottom electrodes. The current through the memory device 2300 is measured during application of the voltage.

Referring now to FIG. 24, an initial voltage of −0.1V is applied to the memory device 2300 and the current is measured to provide a resistive value. As can be seen from FIG. 24, the gradient of the I-V curve changes by increasing voltage. The memory device 2300 has a high resistive state (HRS/OFF) of around $10^5$ ohms.

Figure 25:
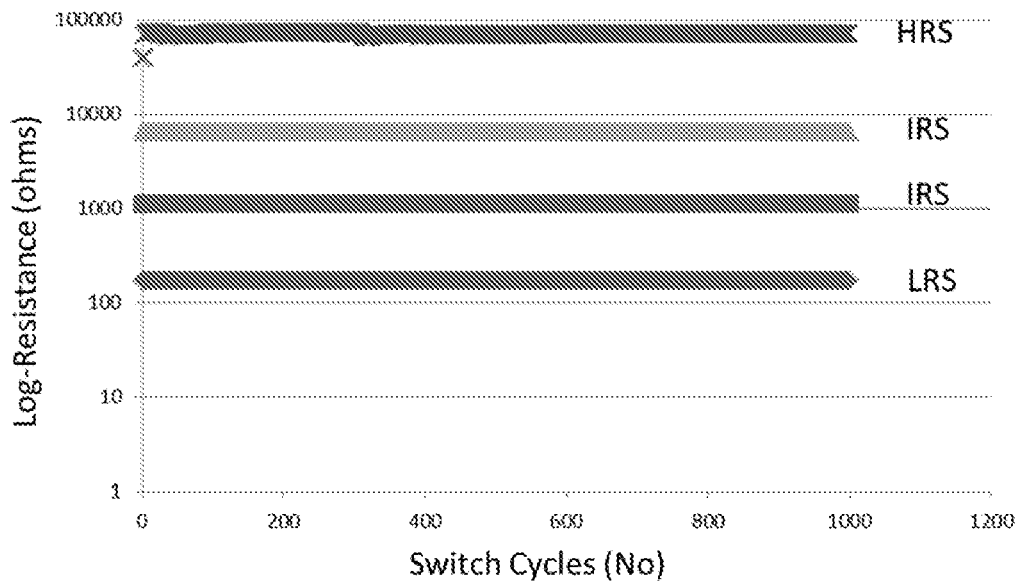
FIG. 25 shows the stability of the electrical resistive states of memory device 2300 over multiple ON/OFF cycles.

It is evident from FIG. 25 that the memory device 2300 has 4 distinctive resistive states.

Reversible resistive switching properties are displayed by memory device 2300. By applying a potential across the electrodes the device can be set from the high resistive state (HRS/OFF) to the low resistive state (LRS/ON). Additionally two intermediate resistive states are exhibited by memory device 2300. A suitable voltage range to set and reset the memory device 2300 is between −10V to 10V.

FIG. 25 shows the stability of the four resistive states of memory device 2300 over a number of switching cycles. The stability of the resistive states was tested in the same manner as described above in Example 4.

As evident from FIG. 25, the LRS/ON state was maintained stably at a resistance of around 200 ohms over 1,000 switching cycles. The HRS/OFF state was maintained stably at a resistance of around $10^5$ ohms over 1000 switching cycles. Additionally, memory device 2300 exhibited two intermediate resistive states at around 1000 ohms and 9000 ohms. All two intermediate resistive states were maintained stably over 1000 switching cycles.

By using the spin coating method, tuneable resistive switching properties can also be realized. For example, the memory device 2300 of FIG. 23 includes two $CeO_2$/In-doped $CeO_2$ layer pairs and exhibits four distinctive resistive states in FIG. 25.

Figure 26:
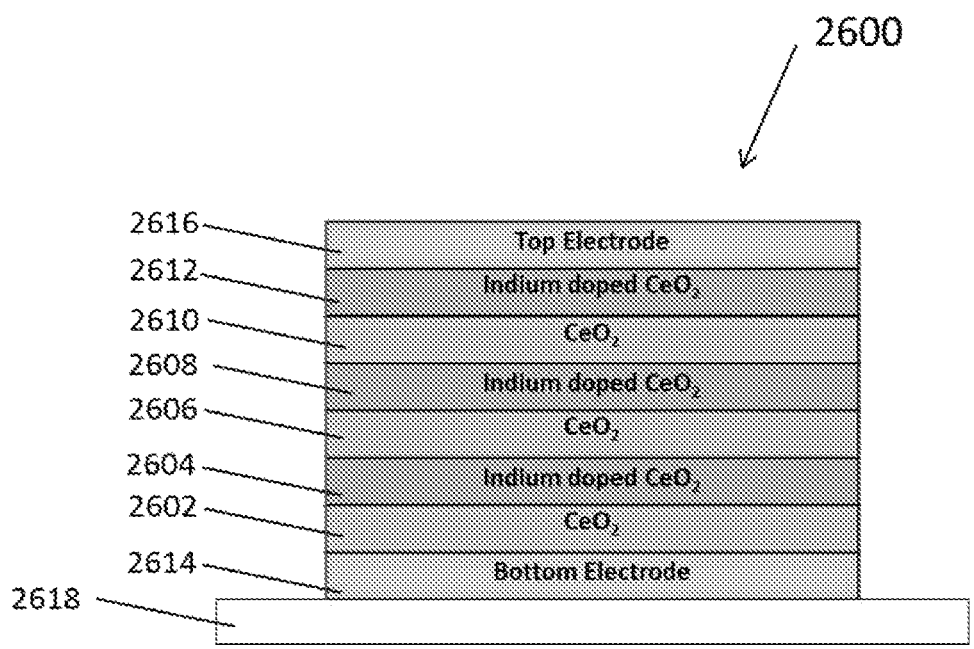
FIG. 26 is an illustration of a further multiple layer memory device 2600.

2.9 Example 12: Memory Device—Spin Coated on Silicon with Three Pairs of $CeO_2$/In-Doped $CeO_2$ Layers 2.9.1 Memory Device with Three Pairs of $CeO_2$/In-Doped $CeO_2$ Layers—Structure FIG. 26 is an illustration of a further multiple layer memory device 2600. The memory device 2600 includes a first layer of $CeO_2$ nanocubes 2602, a first layer of In-doped $CeO_2$ nanocubes 2604, a second layer of $CeO_2$ nanocubes 2606, a second layer of In-doped $CeO_2$ nanocubes 2608, a third layer of $CeO_2$ nanocubes 2610, and a third layer of In-doped $CeO_2$ nanocubes 2612. The layers are positioned adjacent to each other in an alternating configuration of $CeO_2$ and In-doped $CeO_2$ layers. Consequently the memory device 2600 includes three $CeO_2$/In-doped $CeO_2$ layer pairs.

Memory device 2600 includes a bottom electrode 2614 and a top electrode 2616. The electrodes are gold (Au). The bottom electrode is mounted on a silicon substrate 2618

The dimensions of memory device 2600 are 1 cm (W)×1 cm (L).

2.9.2 Memory Device with Three Pairs of $CeO_2$/In-Doped $CeO_2$ Layers—Method of Manufacture The description of the spin coating method of manufacture is set out in Section 1.6.2

Figure 27:
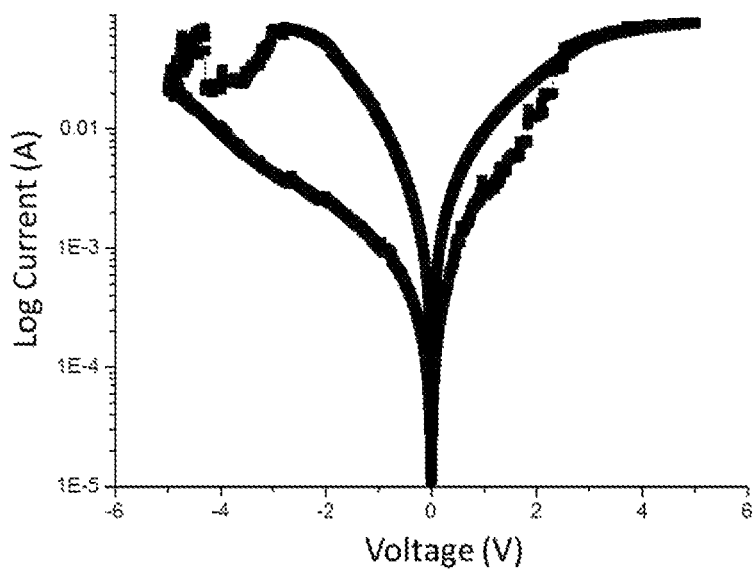
FIG. 27 shows the voltage-current characteristics of the memory device 2600

2.9.3 Memory Device with Three Pairs of $CeO_2$/In-Doped $CeO_2$ Layers—Resistive Properties FIG. 27 shows the voltage-logarithmic current characteristics of the memory device 2600 of FIG. 26. The measurement method is the same as described above. Specifically, a voltage is applied across the top and bottom electrodes. The current through the memory device 2600 is measured during application of the voltage.

Referring now to FIG. 27, an initial voltage of 0.1V is applied to the memory device 2600 and the current is measured to provide a resistance value. As can be seen from FIG. 27, the gradient of the I-V curve remains relatively constant between 0 V and 1 V. Within this voltage range, the memory device 2600 has a high resistive state (HRS/OFF) of around $10^7$ ohms.

Figure 28:
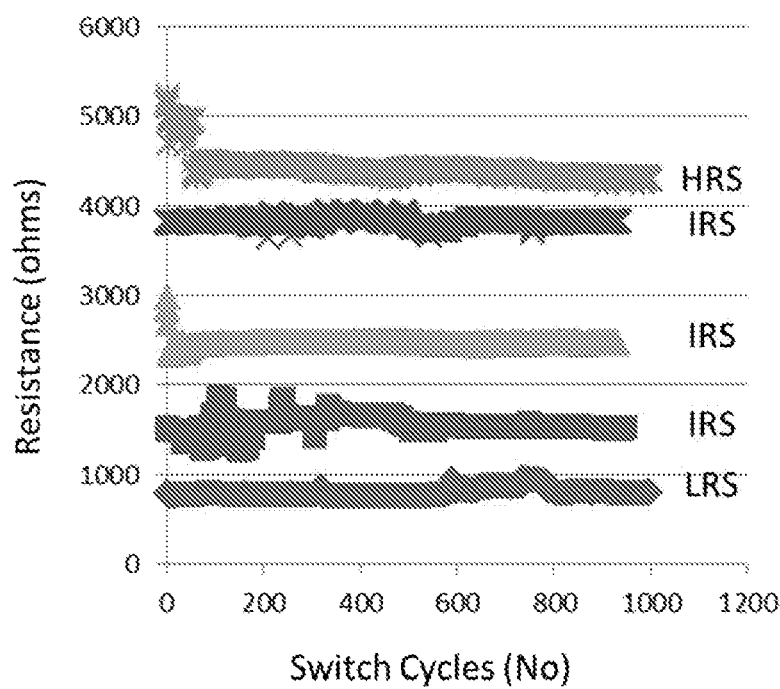
FIG. 28 shows the stability of the electrical resistive states of memory device 2600 over multiple ON/OFF cycles.

It is evident from FIG. 28 that the memory device 2600 has five distinctive resistive states.

Reversible resistive switching properties are displayed by memory device 2600. By applying a potential across the electrodes the device can be set from high resistive state (HRS/OFF) to low resistive state (LRS/ON). Additionally three intermediate states are exhibited by memory device 2600. A suitable voltage range to set and reset the memory device 2600 is between −10V to 10V.

FIG. 28 shows the stability of the five resistive states of memory device 2600 over a number of switching cycles. The stability of the resistive states was tested in the same manner as described above in Example 4.

As evident from FIG. 28, the LRS/ON state was maintained stably at a resistance of around 900 ohms over 1000 switching cycles. The HRS/OFF state was maintained stable at a resistance of around 4500 ohms over 1000 switching cycles. Additionally, memory device 2600 exhibited three intermediate resistive states at around 1500 ohms, 2300 ohms and at around 4000 ohms. All three intermediate resistive states were maintained stably over 1000 switching cycles.

Again, by changing the layer structure, tuneable resistive switching properties can be realized. For example, the memory device 2600 of FIG. 26 includes three $CeO_2$/In-doped $CeO_2$ layer pairs and exhibits five distinctive resistive states in FIG. 28.

3. Order of Positioning Layers

The memory device illustrated in FIG. 14 includes four pairs of $CeO_2$ nanocubes and In-doped $CeO_2$ nanocubes layers. The layers could also be positioned adjacent to each other from a bottom layer of In-doped $CeO_2$ nanocubes to a top layer of $CeO_2$ nanocubes.

Figure 29:
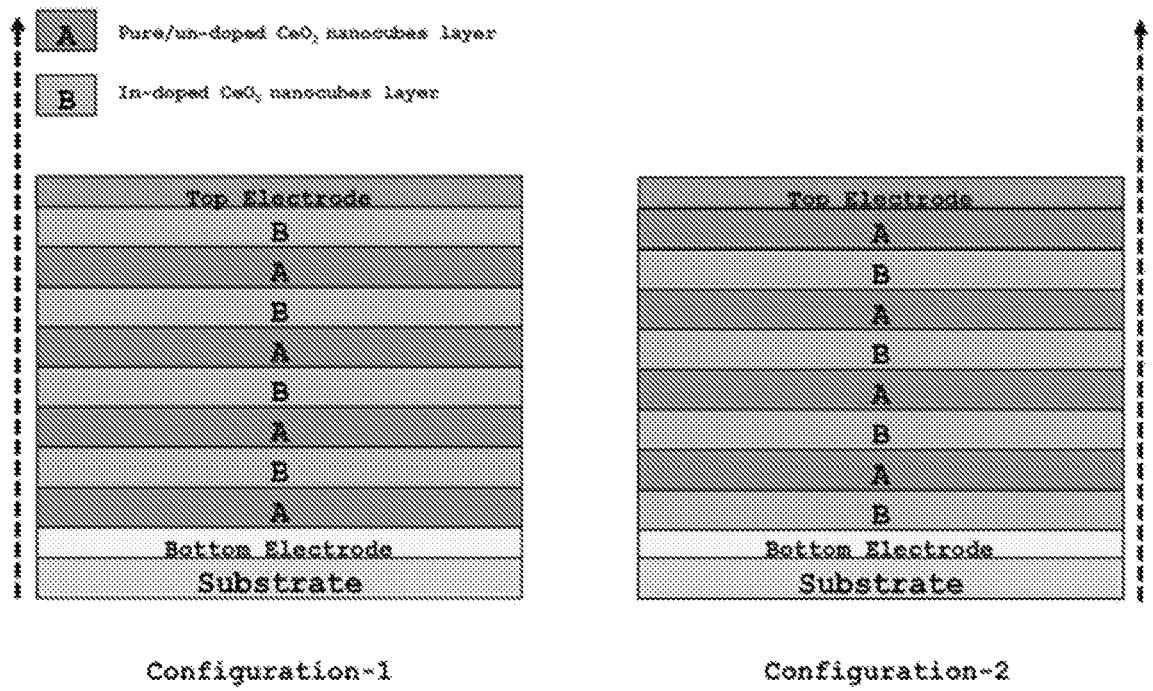
FIG. 29 illustrates different configurations of the example of FIG. 14.

FIG. 29 illustrates different configurations of the example of FIG. 14. In Configuration 1 a layer of $CeO_2$ nanocubes is adjacent to the bottom electrode. The layers are then positioned adjacent to each other in an alternating configuration up to a layer of In-doped $CeO_2$ nanocubes adjacent to the top electrode. In contrast, in configuration 2, an In-doped $CeO_2$ nanocube layer is adjacent to the bottom electrode. The layers are then positioned adjacent to each other in an alternating configuration up to a layer of $CeO_2$ nanocubes adjacent to the top electrode.

In further embodiments, the example structures of any of FIG. 2, 5, 8, 11, 14, 17, 20, 23 or 26 could be positioned adjacent to each other in an alternating configuration starting with an In-doped $CeO_2$ nanocube layer on the bottom electrode and alternating layers positioned adjacent to each other up to a layer of $CeO_2$ nanocubes attached to the top electrode.

4. Resistive Properties—Trends

As mentioned previously, the memory structure described in the embodiments has particular application in a memory device. Accordingly, the description elaborates on how the memory structure has application in a memory device.

Without wishing to be bound by theory, the inventors hypothesise that when an electrical potential (electromotive force) is applied to the top and bottom electrodes and ions from the top electrode move into the layers and form a nanoscale filament between the top and bottom electrodes. When the filament exists between the top and bottom electrodes, there is a relatively low resistive between the electrodes.

To remove the filament between the top and bottom electrodes the current is reversed, causing the ions forming the filament to retreat back to the top electrode. Once the ions have retreated to the top electrode the filament is removed and a high resistance exists between the top and bottom electrodes. It is this ability to change the resistance between the top and bottom electrodes that allows the structure to be used in a memory device. Binary data in the form of a 1 and 0 can be represented by a high and low resistive state between the top and bottom electrodes. Where intermediate resistive states exist, these may be used to store additional data in a simple encoded form.

4.1 Resistive Properties—Examples 4 to 8 (Memory Structure Drop Coated on Silicon)

The resistive performance of examples 4 to 8 (drop coated on silicon) has demonstrated an increase in the number of resistive states as the number of $CeO_2$/In-doped $CeO_2$ layer pairs are increased.

In particular, the increase in resistive states is demonstrated for $CeO_2$/In-doped $CeO_2$ layer pairs using gold electrodes. In particular, the increase in resistive states is demonstrated for $CeO_2$/In-doped $CeO_2$ layer pairs using gold (Au) electrodes mounted on silicon (Si) substrate.

Table 1 illustrates the number of $CeO_2$ and In-doped $CeO_2$ layer pairs and the number of resistive states that were tested in examples 4 to 8.

| Example Number | Number of layers | Number of resistive states (from figures, positive voltages only) | |
|---|---|---|---|
| 4 | 1 × $CeO_2$ | FIG. 4 | 2 |
| 5 | 1 × $CeO_2$ and In-doped $CeO_2$ pair plus a $CeO_2$ layer | FIG. 7 | 2 |
| 6 | 2 × $CeO_2$ and In-doped $CeO_2$ pairs | FIG. 10 | 4 |
| 7 | 3 × $CeO_2$ and In-doped $CeO_2$ pairs | FIG. 13 | 5 |
| 8 | 4 × $CeO_2$ and In-doped $CeO_2$ pairs | FIG. 16 | 6 |

4.2 Resistive Properties—Example 9 (Memory Structure Inkjet Printed on Silicon)

The resistive performance of examples 9 (inkjet printed on silicon) has demonstrated four number of resistive states in two layer pairs of $CeO_2$/In-doped $CeO_2$.

In particular, the four resistive states demonstrated for two layer pairs of $CeO_2$/In-doped $CeO_2$ using gold electrodes. In particular, the four resistive states is demonstrated for two layer pairs $CeO_2$/In-doped $CeO_2$ using gold (Au) electrodes mounted on silicon substrate.

Table 2 illustrates the number of $CeO_2$ and In-doped $CeO_2$ layer pairs and the number of resistive states that were tested in example 9.

| Example Number | Number of layers | Number of resistive states (from figures, positive voltages only) | |
|---|---|---|---|
| 9 | 2 × $CeO_2$ and In-doped $CeO_2$ pairs | FIG. 19 | 4 |

4.3 Resistive Properties—Example 10 (Memory Structure Spin Coated on Glass)

The resistive performance of examples 10 (spin coated on glass) has demonstrated four number of resistive states in two layer pairs of $CeO_2$/In-doped $CeO_2$.

In particular, the four resistive states demonstrated for two layer pairs of $CeO_2$/In-doped $CeO_2$ using silver top electrodes and FTO bottom electrodes. In particular, the four resistive states is demonstrated for two layer pairs $CeO_2$/In-doped $CeO_2$ using silver (Ag) top electrodes and FTO bottom electrodes mounted on glass substrate.

Table 3 illustrates the number of $CeO_2$ and In-doped $CeO_2$ layer pairs and the number of resistive states that were tested in example 10.

| Example Number | Number of layers | Number of resistive states (from figures, positive voltages only) | |
|---|---|---|---|
| 10 | 2 × $CeO_2$ and In-doped $CeO_2$ pairs | FIG. 22 | 4 |

4.4 Resistive Properties—Examples 11 to 12 (Memory Structure Spin Coated on Silicon)

The resistive performance of examples 11 to 12 (spin coated on silicon) has demonstrated an increase in the number of resistive states as the number of $CeO_2$/In-doped $CeO_2$ layer pairs are increased.

In particular, the increase in resistive states is demonstrated for $CeO_2$/In-doped $CeO_2$ layer pairs using gold electrodes. In particular, the increase in resistive states is demonstrated for $CeO_2$/In-doped $CeO_2$ layer pairs using gold (Au) electrodes mounted on silicon (Si) substrate.

Table 4 illustrates the number of $CeO_2$ and In-doped $CeO_2$ layer pairs and the number of resistive states that were tested in examples 11 to 12.

| Example Number | Number of layers | Number of resistive states (from figures, positive voltages only) | |
|---|---|---|---|
| 11 | 2 × $CeO_2$ and In-doped $CeO_2$ pairs | FIG. 25 | 4 |
| 12 | 3 × $CeO_2$ and In-doped $CeO_2$ pairs | FIG. 28 | 5 |

4.5 Resistive Properties Summary—Examples 4 to 12

The variations in the memory structure alter the oxygen vacancies, which increases or decreases the number of resistive states.

Different layers having dopants can possess either a higher or lower content of oxygen vacancies that can serve as charge traps. The resistance of the memory device can be changed to the desired resistive state by applying the specific electric fields required.

The number of $CeO_2$ and In-doped $CeO_2$ layer pairs and the number of resistive states for drop coated method on silicon, inkjet method on silicon, spin coated method on glass and spin coated method on silicon can be observed from Table 1, Table 2, Table 3 and Table 4 respectively. As observed in Table 1 to 4, when added in pairs of doped and undoped layers as shown above, additional In-doped $CeO_2$ layer contribute to an increase in the number of intermediate resistance states, and thus a multilevel memory structure can be realised.

A person skilled in the art will understand that various factors for example substrate material, layer thickness and electrode material may affect the resistive properties of the memory structure. However as shown in the examples above, the increase in the number of alternating layer pairs may result in an increase of the number of resistive states in a particular memory device.

In each of the examples 4 to 12, incremental positive voltage was applied to the sample from zero volts. After application of a maximum voltage, the voltage was reduced until an off state was reached. Additional stable resistive states can be accessed by applying incremental negative voltages to the sample from zero volts. Therefore, the use of negative potential can be used to increase the number of resistive states of the memory structure.

5. Applications

Preferred applications for the memory structure are within memory devices and/or their components that utilise multiple resistive states to store one or more binary bits of data (i.e. more than a single binary digit).

For example, one embodiment of the memory structure could be used in the manufacture of a memory device comprising of multiple memory cells, each cell having multiple resistive states, with each cell able to store multiple binary bits of data according to the number of resistive states.

A multilevel memory device requires a memory structure having more than two resistive states. A memory structure containing more than two resistive states is considered to be multilevel and have increased memory storage potential. Example 8 demonstrates a multilevel memory structure on silicon with 6 resistive states that can store more than one binary bit of data. Example 10 demonstrates a multilevel memory structure on glass with 4 resistive states that can store more than one binary bit of data.

The number of $CeO_2$ and In-doped $CeO_2$ layer pairs can be engineered in a controlled manner to increase or decrease the number of resistive states depending on the requirements of the intended application.

In terms of manufacturing metal oxide layers in this invention, varieties of techniques are primarily used such as physical and chemical deposition methods. These manufacturing processes regularly operate under high temperature and vacuum conditions (which may limit the fabrication of metal oxide thin films to silicon substrates and involve higher capital cost).

However, along with traditional methods of manufacture such as physical and chemical deposition methods, the metal oxide memory structure in this invention may also be manufactured through solution processed techniques. Examples of these include spin coating, spray coating and printing. This enables the memory structure to be fabricated onto a range of substrates including silicon, plastic, glass, and other suitable substrates under room temperature which may offer flexibility and lower manufacturing cost.

Memory structures can be stacked on top of each other to produce a stacked memory device. This may increase the density of the memory device without increasing the substrate area. The stacked memory device may be arranged in various configurations including but not limited to a crossbar structure. The stacked memory device may be manufactured through physical deposition methods, chemical deposition methods and solution processed techniques as discussed above.

From the foregoing and with reference to the various figures, those skilled in the art will appreciate that certain modifications can also be made to the memory structure and its various components without departing from the spirit and scope of this specification. While several embodiments of the memory structure have been shown and described within this specification, it is not intended that this specification be limited thereto, as it is intended that the specification be as broad in scope as the art will allow and that the specification be read likewise. Therefore this specification should not be construed as limiting, but merely as exemplification of particular embodiments. Those skilled in the art will readily envisage other modifications with the spirit and scope of this specification.

6. Memory Device

Figure 31:
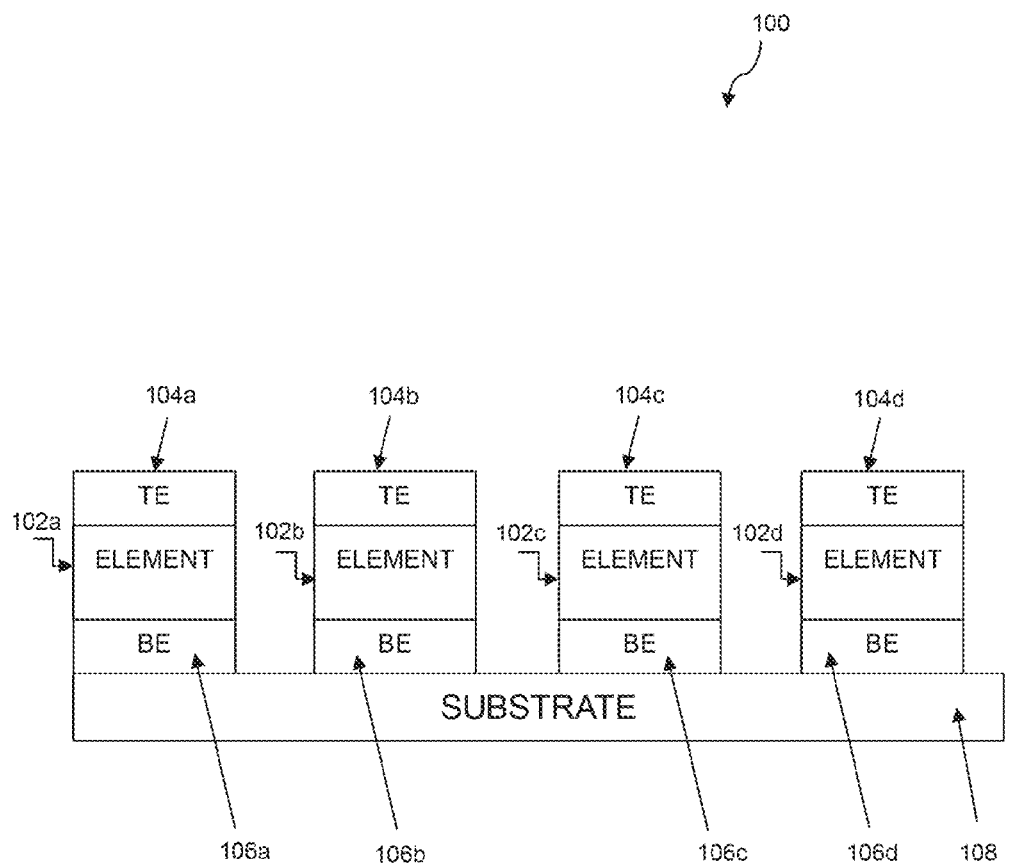
FIG. 31 illustrates a first side profile view of a structure for use in a memory device.

Herein described, with reference to FIG. 31, is a side profile view of a structure 100 for use in a memory device. As can be seen in FIG. 31, the structure 100 comprises a plurality of elements 102. Each of the elements 102 is made of a metal oxide material and in particular cerium oxide. Each of the elements 102 is also in the form of a nanocube.

Typically, the elements 102 have a width of approximately 10 nanometers, but the width can be different in alternative embodiments of the structure 100. Positioned on top and at the bottom of each element 102 is a top electrode 104 and a bottom electrode 106. The top electrode 104 of the structure 100 is made from titanium nitride, but it is envisaged that in alternative embodiments of the structure 100 the top electrode 104 can be made from other suitable materials. In relation to the bottom electrode 106 this electrode 106 can be made from a range of different materials including, but not limited to: platinum, iridium, gold or any combination thereof. The thickness of the top electrode 104 is approximately 70 nanometers while the thickness of the bottom electrode is approximately 60 nanometers. The thicknesses of the top electrode 104 and the thickness of the bottom electrode 106 can, however, are changed to other suitable thicknesses in alternative embodiments of the structure 100.

Like typical semiconductors the structure 100 also includes a substrate layer 108, which in this embodiment is made from silicon based material to form a silicon wafer. However, in alternative embodiments of the structure 100 the substrate layer 108 can be made from other suitable materials. The substrate layer 108 can be whatever thickness is suitable for the intended purpose.

Figure 32:
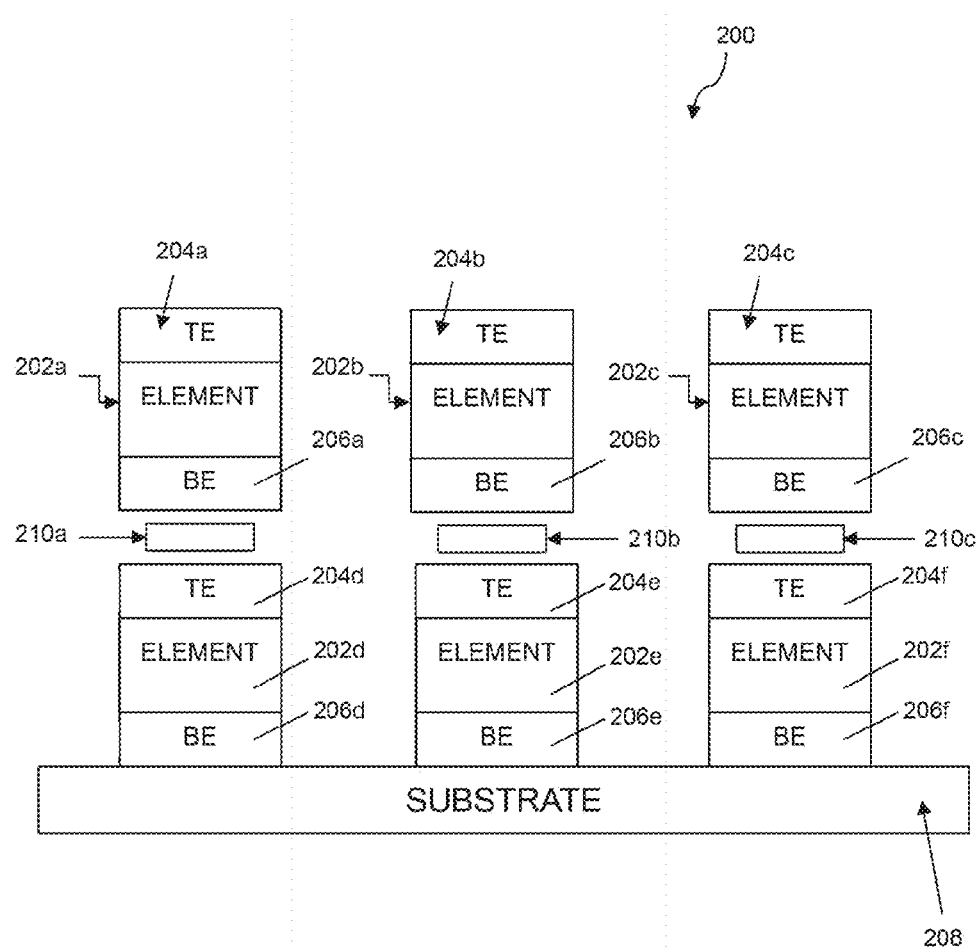
FIG. 32 illustrates a second side profile view of the structure for use in a memory device.

Referring now to FIG. 32, which illustrates a further side view of the structure 200. To increase the data storage capacity of the structure 200 the elements 202 are stacked upon each other, with each stacked element 202 having its own respective top and bottom electrodes 204 and 206 as previously described. An element 202 stacked on top of another element 202 would be separated by another material 210 which is disposed between the respective bottom electrode 206 and top electrode 204 of the stacked elements 202. The material 210 disposed between the top and bottom electrodes 204 and 206 is any suitable material that would ensure the integrity of the electrical properties of the top and bottom electrodes 204 and 206 is not compromised as a result of the elements 202 being stacked on each other.

Figure 33:
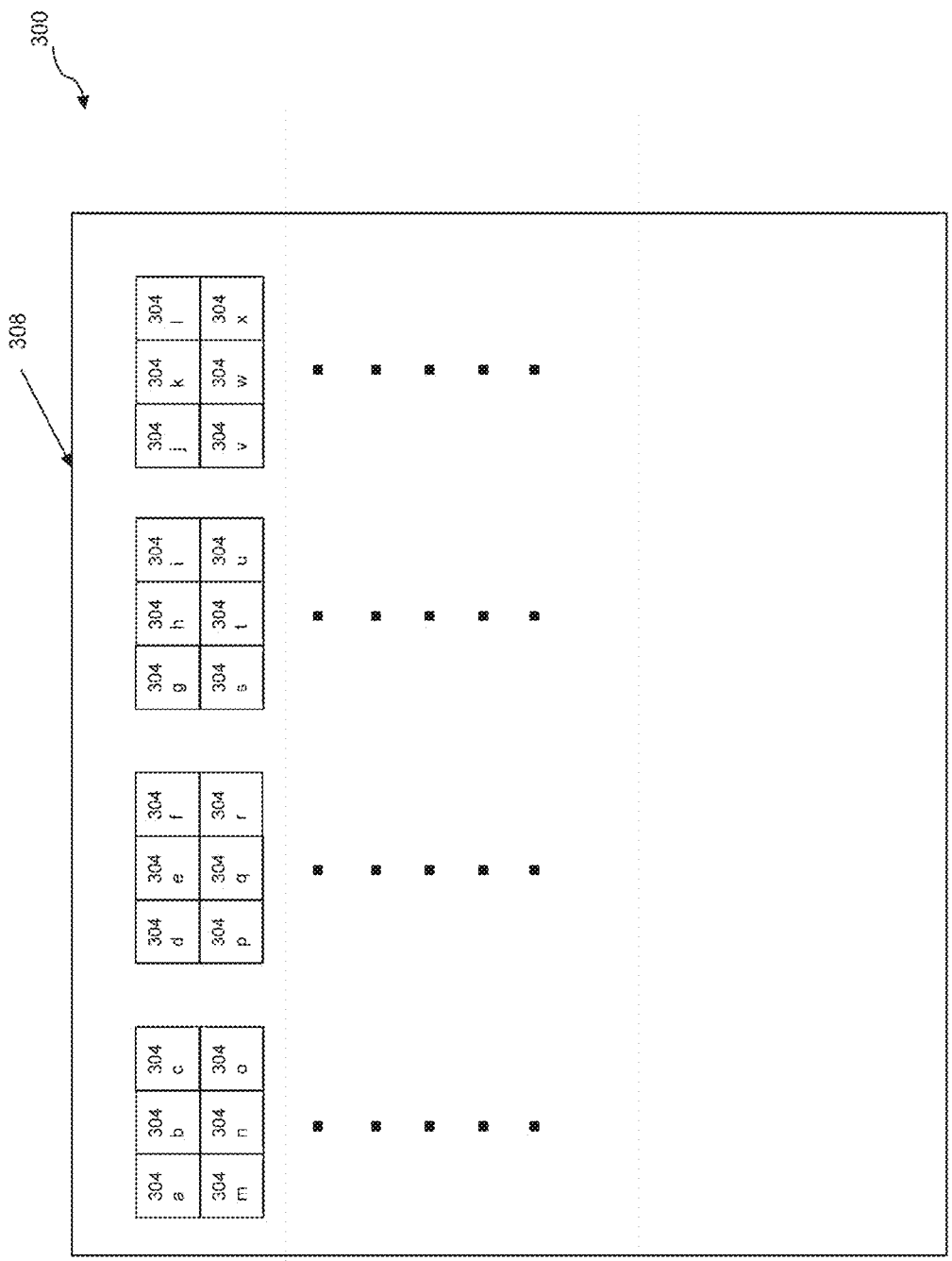
FIG. 33 illustrates a top view of the structure illustrated in FIG. 31.
Figure 34:
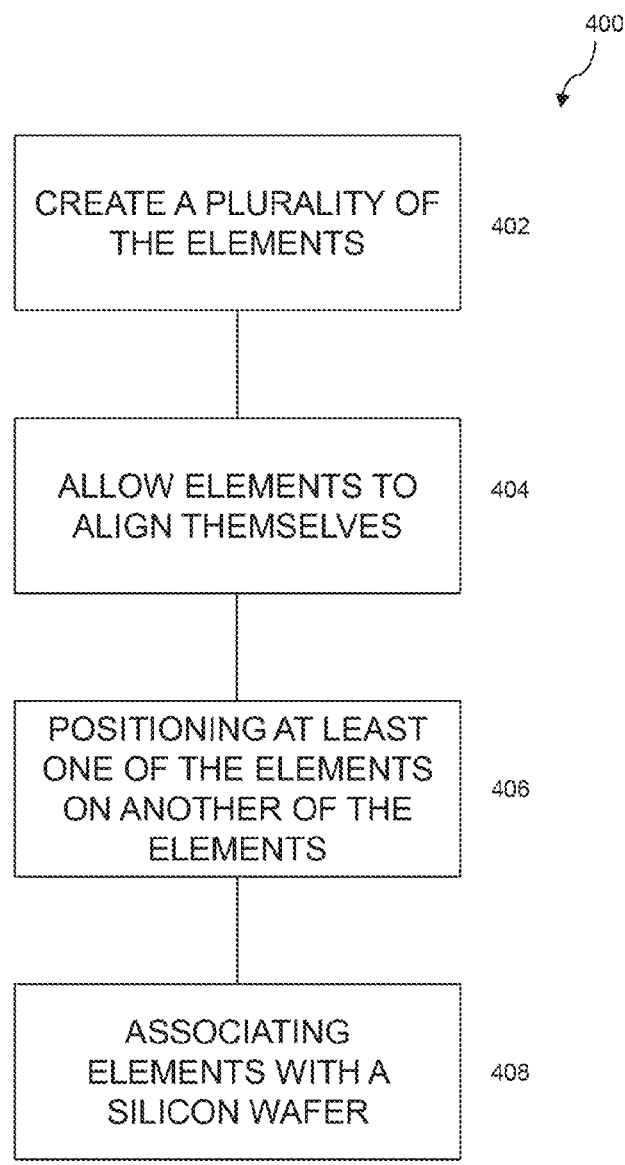
FIG. 34 illustrates a flow chart of a method for use in manufacturing the structure illustrated in FIGS. 31 and 32.

Referring now to FIG. 33, which illustrates a top view of the embodiment of the structure 300. As FIG. 33 shows a top view of the structure 300 only the top electrodes 104 are depicted. However, the particularly important aspect of the structure 300 shown in FIG. 33 all of the elements 302 (and their associated top and bottom electrodes 304 and 306) are arranged to form three-dimensional arrays of the elements. Each of the arrays of elements 302 are spaced apart for adjacent elements 302 in and even and consistence manner (distance).

As mentioned previously, the structure 100 of this described embodiment has particular application to solid statement memory devices. Accordingly, the following description elaborates on how the structure 100 has application to solid state memory devices. Without wishing to be bound by theory, the inventors hypothesise that, when a voltage (electromotive force) is applied to the top and bottom electrodes 104 and 106 ions from the top electrode 104 move into the element 102 and form a nanoscale filament between the top and bottom electrodes 104 and 106. When the filament exists between the top and bottom electrodes 104 and 106 there is a relatively low resistance between the electrodes 104 and 106. To remove the filament between the top and bottom electrodes 104 and 106 the current is reversed and the ions forming the filament are caused to retreat back to the top electrode 104. Once the ions have retreated to the top electrode 104 the filament is removed and thus a high resistance exists between the top and bottom electrodes 104 and 106. It is this ability to change the resistance between the top and bottom electrodes 104 and 106 that allows the structure 100 to be used as a solid state memory device. Binary data in the form of a 1 and 0 can be represented by a high and low resistive state between the top and bottom electrodes 104 and 106.

The various steps involved in an embodiment of a method for manufacturing the structure 100 are illustrated in the flow chart 400 of FIG. 4. The first step 402 involves creating a plurality of the elements 102. The following step 404 involves allowing the elements 102 to align themselves. Subsequent to these two steps 402 and 404 the method involves the step 406 of placing some of the elements 102 on top of other elements to thereby form stacks of the elements 102. The method involves the final step 408 of associating the elements 102 with a silicon wafer 108.

While not illustrated in the flow chart 400, the steps illustrated therein 402 to 408 comprised sub-steps. For example, the step 404 of allowing the elements 102 to allow themselves to become aligned includes several sub-steps. One of the sub-steps involved in allowing the elements 102 to self-align involves the Vander Waals forces to facilitate the alignment of the elements 102. This self-alignment of the elements 102 is such that when aligned the elements 102 form a three-dimensional array of elements 102 as described previously.

From the foregoing and with reference to the various figures, those skilled in the art will appreciate that certain modifications can also be made to the structure 100 of FIGS. 31 to 34 and its various components without departing from the spirit and scope of this specification. While several embodiments of the structure 100 have been shown and described within this specification, it is not intended that this specification be limited thereto, as it is intended that the specification be as broad in scope as the art will allow and that the specification be read likewise. Therefore this specification should not be construed as limiting, but merely as exemplification of particular embodiments. Those skilled in the art will readily envisage other modifications with the spirit and scope of this specification.

Described herein are a number of items:

1. A structure for use in a memory device, the structure comprising a plurality of separate elements, wherein each of the separate elements is such that they have an electrical resistive state that can be changed in response to an electromotive force being applied thereto.

2. The structure of item 1, wherein at least a first of the elements is positioned on at least another of the elements to thereby form a stack of the elements.

3. The structure of item 2, wherein the stack of the elements is adjacent another stack of the elements to thereby form a three dimensional array of the elements.

4. The structure of any of items 1 to 3, wherein the embodiment of the structure, each of the elements is made of a metal oxide substance.

5. The structure of item 4, wherein the metal oxide substance comprises a cerium oxide substance.

6. The structure of any of items 1 to 5 wherein each of the elements is in the form of a nanocube.

7. The structure of any of items 1 to 6, wherein the elements are associated with a silicon wafer.

8. A method for use in manufacturing a structure for use in a memory device, the method comprising the steps of:
creating a plurality of separate elements, wherein each of the separate elements are such that they have an electrical resistive state that can be changed in response to an electromotive force being applied thereto; and
allowing at least one of the separate elements to align itself relative to another of the separate elements.

9. The method of item 8, wherein the step of allowing the at least one of the separate elements to align itself relative to another of the separate elements comprises the step of allowing a van der Waals force to facilitate the at least one of the separate elements to align itself relative to another of the separate elements.

10. The method of item 7 or 9, wherein the method the step of allowing the at least one of the separate elements to align itself relative to another of the separate elements is such that subsequent to allowing the at least one of the separate elements to align itself relative to another of the separate elements the separate elements form a three dimensional array of the elements.

11. The method of any of items 7 to 10, further comprising the step of positioning at least a first of the elements on at least another of the elements to thereby form a stack of the elements.

12. The method of any of items 7 to 11, wherein each of the elements is made of a metal oxide substance.

13. The method of item 12, wherein the metal oxide substance comprises a cerium oxide substance.

14. The method of any of items 7 to 13, wherein each of the elements is in the form of a nano-cube.

15. The method of any of items 7 to 14, further comprising the step of associating the elements with a silicon wafer.

The invention claimed is:

1. A memory structure comprising at least one first layer and at least one second layer:
the at least one first layer comprises a plurality of a first element, and the at least one second layer comprises a plurality of a second element; and,
wherein the memory structure has an electrical resistive state that changes in response to an electromotive force being applied thereto, and wherein the first element and the second element are metal oxide nanocubes.

2. The memory structure according to claim 1, wherein the metal oxide nanocubes are cerium oxide nanocubes.

3. The memory structure according to claim 1, wherein the second element is a doped metal oxide nanocube doped with a dopant.

4. The memory structure according to claim 3, wherein the dopant is a metal oxide that has more oxygen vacancies than metal oxide of the second element.

5. The memory structure according to claim 3, wherein the dopant comprises dopant ions having a valency less than that of other metal oxide ions within the doped metal oxide nanocube.

6. The memory structure according to claim 3, wherein the dopant is one of: indium (In), cobalt (Co), gadolinium (Gd), ytterbium (Yb), and samarium (Sm).

7. The memory structure according to claim 1, wherein the metal oxide nanocubes have a width in a range of from about 2 nm to about 13 nm.

8. The memory structure according to claim 1, wherein the metal oxide nanocubes have a width in a range of from about 5 nm to about 9 nm.

9. The memory structure according to claim 1, wherein the first layer comprises one or more two dimensional arrays of the first element and the second layer comprises one or more two dimensional arrays of the second element.

10. The memory structure according to claim 1, wherein the memory structure comprises:
   a top layer;
   a bottom layer;
   a top electrode electrically connected to the top layer; and
   a bottom electrode electrically connected to the bottom layer, the top electrode and the bottom electrode being configured to apply the electromotive force to the memory structure.

11. The memory structure according to claim 10, wherein at least one of the top electrode and the bottom electrode comprises a conducting or semiconducting material operable as an electrode.

12. The memory structure according to claim 10, wherein an electrode electrically connected to the bottom layer is positioned on a substrate.

13. The memory structure according to claim 1, comprising a layer of metal oxide elements adjacent to a layer of doped metal oxide elements.

14. The memory structure according to claim 13, wherein the memory structure comprises a plurality of paired layers each comprising the layer of the metal oxide elements adjacent to the layer of the doped metal oxide elements, the paired layers being arranged such that a layer of a first paired layer is immediately adjacent to a layer of a second paired layer.

15. The memory structure according to claim 1, wherein the electrical resistive state of the memory structure is a first resistive state and the memory structure has a second resistive state, wherein the first resistive state is higher than the second resistive state, wherein the memory structure switches between the first and second resistive states in response to the electromotive force being applied thereto.

16. The memory structure according to claim 15, wherein the memory structure has at least one intermediate resistive state, the intermediate resistive state having a resistance between the first and the second resistive state and at least one first layer comprises a plurality of a first element, and at least one second layer comprises a plurality of a second element as a paired layer.

17. The memory structure according to claim 16, wherein the memory structure comprises a number of intermediate resistive states and a corresponding number of paired layers.

18. The memory structure according to claim 17, wherein the number of intermediate states of the memory structure increases as the number of paired layers in the memory structure is increased.

19. A method of manufacturing a memory device incorporating a memory structure comprising at least one first layer and at least one second layer: the at least one first layer comprises a plurality of a first element, and the at least one second layer comprises a plurality of a second element, wherein the memory structure has an electrical resistive state that changes in response to an electromotive force being applied thereto and wherein the first element and the second element comprise metal oxide nanocubes, said method comprising the steps of:
   a) depositing an electrode material upon a substrate or utilizing the electrode material as the substrate to provide an electrode,
   b) depositing the at least one first layer comprising the plurality of the first element comprising the metal oxide nanocubes using a chemical or physical deposition process upon the electrode prepared under step (a),
   c) depositing upon the at least one layer deposited in (b), the at least one second layer comprising the plurality of the second element comprising the metal oxide nanocubes using a chemical or physical deposition process, and
   d) depositing the electrode material upon the at least one second layer comprising the plurality of the second element deposited in step (c).

20. A method of manufacturing a memory device incorporating a memory structure comprising at least one first layer and at least one second layer: the at least one first layer comprises a plurality of a first element, and the at least one second layer comprises a plurality of a second element, wherein the memory structure has an electrical resistive state that changes in response to an electromotive force being applied thereto and wherein the first element and the second element comprise metal oxide nanocubes, said method comprising:
   a) depositing an electrode material upon a substrate or utilizing the electrode material as the substrate to provide an electrode,
   b) depositing the at least one first layer comprising the plurality of the first element comprising the metal oxide nanocubes using solution processed techniques upon the electrode prepared under step (a),
   c) depositing upon the at least one layer deposited in (b), the at least one second layer comprising the plurality of the second element comprising the metal oxide nanocubes using solution processed techniques, and
   d) depositing the electrode material upon the at least one second layer comprising a plurality of a second elements deposited in step (c).

21. A method of manufacturing a memory device incorporating a memory structure comprising at least one first layer and at least one second layer, the at least one first layer comprises a plurality of a first element, and the at least one second layer comprises a plurality of a second element, wherein the first element and the second element comprise metal oxide nanocubes, and wherein the at least one first layer and the at least one second layer have an electrical resistive state that can be changed in response to an electromotive force being applied thereto, the method comprising:
   a) printing an electrode material upon a substrate or utilizing the electrode material as the substrate to provide an electrode,
   b) printing a first film of the at least one first layer comprising the plurality of the first element comprising the metal oxide nanocubes upon the electrode prepared under step (a),
   c) printing a second film of the at least one second layer comprising the plurality of the second element comprising the metal oxide nanocubes upon the first film of step (b) and
   d) printing or depositing the electrode material upon the second film of step (c).

22. The method of manufacturing the memory device according to claim 19, further comprises repeating steps (a)-(d) at least once, whereby a stacked memory device is realized in that a top electrode of a first memory structure forms a bottom electrode of a succeeding memory structure.

23. A method of increasing resistive states in a memory device incorporating a memory structure comprising at least one first layer and at least one second layer, the at least one first layer comprises a plurality of a first element, and the at least one second layer comprises a plurality of a second element, and wherein the first element and the second element comprise metal oxide nanocubes, the method comprising increasing a number of paired layers of a metal oxide and a doped metal oxide in the memory structure, wherein each layer of the metal oxide or the doped metal oxide has an electrical resistive state that changes in response to an electromotive force being applied thereto.

24. The method according to claim 23, wherein the metal oxide is cerium(IV) oxide, and the doped metal oxide is indium-doped cerium(IV) oxide.

25. The method of claim 20, wherein a dispersion of cerium (IV) oxide nanocubes and/or a dispersion of indium-doped cerium (IV) oxide nanocubes are used in the solution processed technique.

26. The method of claim 21, wherein a printable ink comprising a dispersion of cerium (IV) oxide nanocubes is used to print the first film and/or the second film.

27. The method of claim 21, wherein a dispersion of indium-doped cerium (IV) oxide nanocubes is used to print the first film and/or the second film.

28. A memory structure according to claim 1, wherein a resistive state that changes in response to an electromotive force being applied to a memory structure is retained after the electromotive force is removed.

29. A memory structure according to claim 1, wherein the memory structure is a flexible memory structure provided upon a flexible substrate.

30. An ink comprising doped or undoped nanocubes for use in fabricating a memory structure according to claim 1.

31. An ink according to claim 30, wherein the undoped nanocubes is cerium (IV) oxide nanocube and the doped nanocube is indium-doped cerium (IV) oxide.

32. The method of manufacturing the memory device according to claim 20, further comprises repeating steps (a)-(d) at least once, whereby a stacked memory device is realized in that a top electrode of a first memory structure forms a bottom electrode of a succeeding memory structure.

33. The method of manufacturing the memory device according to claim 21, further comprises repeating steps (a)-(d) at least once, whereby a stacked memory device is realized in that a top electrode of a first memory structure forms a bottom electrode of a succeeding memory structure.

* * * * *